(12) United States Patent
Lu et al.

(10) Patent No.: US 12,340,855 B2
(45) Date of Patent: Jun. 24, 2025

(54) SHIFT REGISTER UNIT, DRIVE CONTROL CIRCUIT, DISPLAY DEVICE AND DRIVING METHOD

(71) Applicant: BOE Technology Group Co., Ltd., Beijing (CN)

(72) Inventors: Jiangnan Lu, Beijing (CN); Guangliang Shang, Beijing (CN); Jianchao Zhu, Beijing (CN); Zhenzhen Shan, Beijing (CN); Xing Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/245,030

(22) PCT Filed: May 26, 2022

(86) PCT No.: PCT/CN2022/095253
§ 371 (c)(1),
(2) Date: Mar. 13, 2023

(87) PCT Pub. No.: WO2023/225946
PCT Pub. Date: Nov. 30, 2023

(65) Prior Publication Data
US 2024/0304266 A1    Sep. 12, 2024

(51) Int. Cl.
*G09G 3/3225*  (2016.01)
*G11C 19/28*  (2006.01)

(52) U.S. Cl.
CPC .......... *G11C 19/287* (2013.01); *G09G 3/3225* (2013.01); *G09G 2300/0426* (2013.01); *G09G 2310/0286* (2013.01)

(58) Field of Classification Search
CPC ............... G11C 19/287; G09G 3/3225; G09G 2300/0426; G09G 2310/0286
See application file for complete search history.

(56) References Cited

U.S. PATENT DOCUMENTS

2006/0139292 A1    6/2006  Yoon et al.
2009/0310734 A1   12/2009  Umezaki
2011/0157124 A1    6/2011  Jung et al.
(Continued)

FOREIGN PATENT DOCUMENTS

CN        1797509 A    7/2006
CN      102117659 A    7/2011
(Continued)

*Primary Examiner* — Dennis P Joseph
(74) *Attorney, Agent, or Firm* — Workman Nydegger

(57) ABSTRACT

A shift register unit includes: an input circuit configured to provide an input signal to a first node in response to a first clock signal; a reset circuit configured to provide a first reference signal to a second node in response to a second clock signal; a first control circuit configured to provide the second clock signal to the second node in response to a first control signal; an output circuit configured to provide a third clock signal to a drive output terminal in response to a signal of the first node, and provide a second reference signal to the drive output terminal in response to a signal of the second node; where a duration of an active level of the first control signal is longer than a duration of an active level of a signal of the drive output terminal.

17 Claims, 13 Drawing Sheets

(56) References Cited

U.S. PATENT DOCUMENTS

| | | |
|---|---|---|
| 2011/0273417 A1 | 11/2011 | Shin et al. |
| 2011/0298771 A1 | 12/2011 | Yoo et al. |
| 2012/0293401 A1 | 11/2012 | Li et al. |
| 2014/0098013 A1 | 4/2014 | Chen |
| 2016/0055814 A1 | 2/2016 | Yang et al. |
| 2016/0189626 A1 | 6/2016 | Sun |
| 2017/0110050 A1 | 4/2017 | Park et al. |
| 2017/0123539 A1 | 5/2017 | Wang et al. |
| 2017/0193885 A1 | 7/2017 | Feng et al. |
| 2021/0065630 A1 | 3/2021 | Feng et al. |
| 2021/0065647 A1 | 3/2021 | Tang et al. |
| 2021/0150989 A1* | 5/2021 | Shi ................... G09G 3/3225 |
| 2021/0319737 A1 | 10/2021 | Hwang |
| 2021/0343357 A1 | 11/2021 | Yuan et al. |

FOREIGN PATENT DOCUMENTS

| | | |
|---|---|---|
| CN | 102237031 A | 11/2011 |
| CN | 102654982 A | 9/2012 |
| CN | 102930812 A | 2/2013 |
| CN | 103236273 A | 8/2013 |
| CN | 103943053 A | 7/2014 |
| CN | 104409045 A | 3/2015 |
| CN | 104505042 A | 4/2015 |
| CN | 105206218 A | 12/2015 |
| CN | 105280135 A | 1/2016 |
| CN | 105609136 A | 5/2016 |
| CN | 106601192 A | 4/2017 |
| CN | 109949749 A | 6/2019 |
| CN | 110189675 A | 8/2019 |
| CN | 110415637 A | 11/2019 |
| CN | 111243649 A | 6/2020 |
| CN | 113053293 A | 6/2021 |
| CN | 113516936 A | 10/2021 |
| CN | 113763859 A | 12/2021 |
| CN | 114097020 A | 2/2022 |
| JP | 5696923 B2 | 2/2015 |
| KR | 20070002556 A | 1/2007 |
| KR | 20120044771 A | 5/2012 |
| KR | 20130135629 A | 12/2013 |
| KR | 20190024367 A | 3/2019 |

* cited by examiner

SHIFT REGISTER UNIT, DRIVE CONTROL CIRCUIT, DISPLAY DEVICE AND DRIVING METHOD

This application is a National Stage of International Application No. PCT/CN2022/095253, filed on May 26, 2022, which is hereby incorporated by reference in its entirety.

FIELD

The disclosure relates to the field of display technology, and particularly to a shift register unit, a drive control circuit, a display device and a driving method.

BACKGROUND

With the rapid development of display technology, display devices are increasingly developing towards the direction of high integration and low cost, and the GOA (Gate Driver on Array) technology integrates a TFT (Thin Film Transistor) drive control circuit on the array substrate of the display device to form a drive for the display device. Here, the drive control circuit generally includes a plurality of cascaded shift register units. However, the output of the shift register unit is unstable, causing the abnormal display.

SUMMARY

An embodiment of the disclosure provides a shift register unit, including: an input circuit configured to provide an input signal to a first node in response to a first clock signal: a reset circuit configured to provide a first reference signal to a second node in response to a second clock signal: a first control circuit configured to provide the second clock signal to the second node in response to a first control signal: an output circuit configured to provide a third clock signal to a drive output terminal in response to a signal of the first node, and provide a second reference signal to the drive output terminal in response to a signal of the second node; where a duration of an active level of the first control signal is longer than a duration of an active level of a signal of the drive output terminal.

In some embodiments, the duration of the active level of the first control signal is approximately equal to twice the duration of the active level of the signal of the drive output terminal.

In some embodiments, the first control circuit includes a first transistor: a control electrode of the first transistor is configured to receive the first control signal, a first electrode of the first transistor is configured to receive the second clock signal, and a second electrode of the first transistor is coupled to the second node.

In some embodiments, the input circuit includes a second transistor; a control electrode of the second transistor is configured to receive the first clock signal, a first electrode of the second transistor is configured to receive the input signal, and a second electrode of the second transistor is coupled to the first node.

In some embodiments, the input circuit further includes a third transistor; and the second electrode of the second transistor is coupled to the first node through the third transistor; a control electrode of the third transistor is configured to receive the first clock signal, a first electrode of the third transistor is coupled to the second electrode of the second transistor, and a second electrode of the third transistor is coupled to the first node.

In some embodiments, the shift register unit further includes: a first noise reduction circuit: the first noise reduction circuit is configured to provide the third clock signal to the first electrode of the third transistor in response to the signal of the drive output terminal.

In some embodiments, the first noise reduction circuit includes: a fourth transistor; a control electrode of the fourth transistor is coupled to the drive output terminal, a first electrode of the fourth transistor is configured to receive the third clock signal, and a second electrode of the fourth transistor is coupled to the first electrode of the third transistor.

In some embodiments, the first control circuit is coupled to the first electrode of the third transistor, and a signal of the first electrode of the third transistor is the first control signal.

In some embodiments, the first control circuit is coupled to the first node, and the signal of the first node is the first control signal.

In some embodiments, the output circuit includes: a fifth transistor, a sixth transistor and a first capacitor: a control electrode of the fifth transistor is coupled to the first node, a first electrode of the fifth transistor is configured to receive the third clock signal, and a second electrode of the fifth transistor is coupled to the drive output terminal: a control electrode of the sixth transistor is coupled to the second node, a first electrode of the sixth transistor is configured to receive the second reference signal, and a second electrode of the sixth transistor is coupled to the drive output terminal: a first electrode plate of the first capacitor is coupled to the first node, and a second electrode plate of the first capacitor is coupled to the drive output terminal.

In some embodiments, the output circuit further includes: a second capacitor: a first electrode plate of the second capacitor is coupled to the second node, and a second electrode plate of the second capacitor is configured to receive the second reference signal.

In some embodiments, the shift register unit further includes: a second control circuit: the second control circuit is configured to provide the second reference signal to the first node in response to the signal of the second node.

In some embodiments, the second control circuit includes: a seventh transistor: a control electrode of the seventh transistor is coupled to the second node, a first electrode of the seventh transistor is configured to receive the second reference signal, and a second electrode of the seventh transistor is coupled to the first node.

In some embodiments, the second control circuit further includes: an eighth transistor; and the second electrode of the seventh transistor is coupled to the first node through the eighth transistor: a control electrode of the eighth transistor is coupled to the second node, a first electrode of the eighth transistor is coupled to the second electrode of the seventh transistor, and a second electrode of the eighth transistor is coupled to the first node.

In some embodiments, the shift register unit further includes: a second noise reduction circuit: the second noise reduction circuit is configured to provide the first reference signal to the first electrode of the eighth transistor in response to the signal of the first node.

In some embodiments, the second noise reduction circuit includes: a ninth transistor: a control electrode of the ninth transistor is coupled to the first node, a first electrode of the ninth transistor is configured to receive the first reference signal, and a second electrode of the ninth transistor is coupled to the first electrode of the eighth transistor.

In some embodiments, the reset circuit includes a tenth transistor: a control electrode of the tenth transistor is configured to receive the second clock signal, a first electrode of the tenth transistor is configured to receive the first reference signal, and a second electrode of the tenth transistor is coupled to the second node.

An embodiment of the disclosure provides a drive control circuit, including a plurality of cascaded shift register units described above: an input signal of a first-stage shift register unit is provided by a frame trigger signal terminal: among shift register units in two adjacent stages, an input signal of a next-stage shift register unit is provided by the drive output terminal of a previous-stage shift register unit.

An embodiment of the disclosure provides a display device, including the above-mentioned drive control circuit.

An embodiment of the disclosure provides a driving method for the above-mentioned shift register unit, including: in an input phase, providing, by the input circuit, the input signal to the first node in response to the first clock signal: providing, by the first control circuit, the second clock signal to the second node in response to the first control signal; and providing, by the output circuit, the third clock signal to the drive output terminal in response to the signal of the first node: in an output phase, providing, by the first control circuit, the second clock signal to the second node in response to the first control signal; and providing, by the output circuit, the third clock signal to the drive output terminal in response to the signal of the first node: in a reset phase, providing, by the reset circuit, the first reference signal to the second node in response to the second clock signal; and providing, by the output circuit, the second reference signal to the drive output terminal in response to a signal of the second node.

DETAILED DESCRIPTION OF EMBODIMENTS

In order to make purposes, technical solutions and advantages of the disclosure clearer, the technical solutions of embodiments of the disclosure will be described clearly and completely below in combination with the accompanying drawings of embodiments of the disclosure. Obviously the described embodiments are a part of embodiments of the disclosure but not all embodiments. Also in the case of no conflict, embodiments and the features therein in the disclosure can be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It should be noted that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Figure 1:
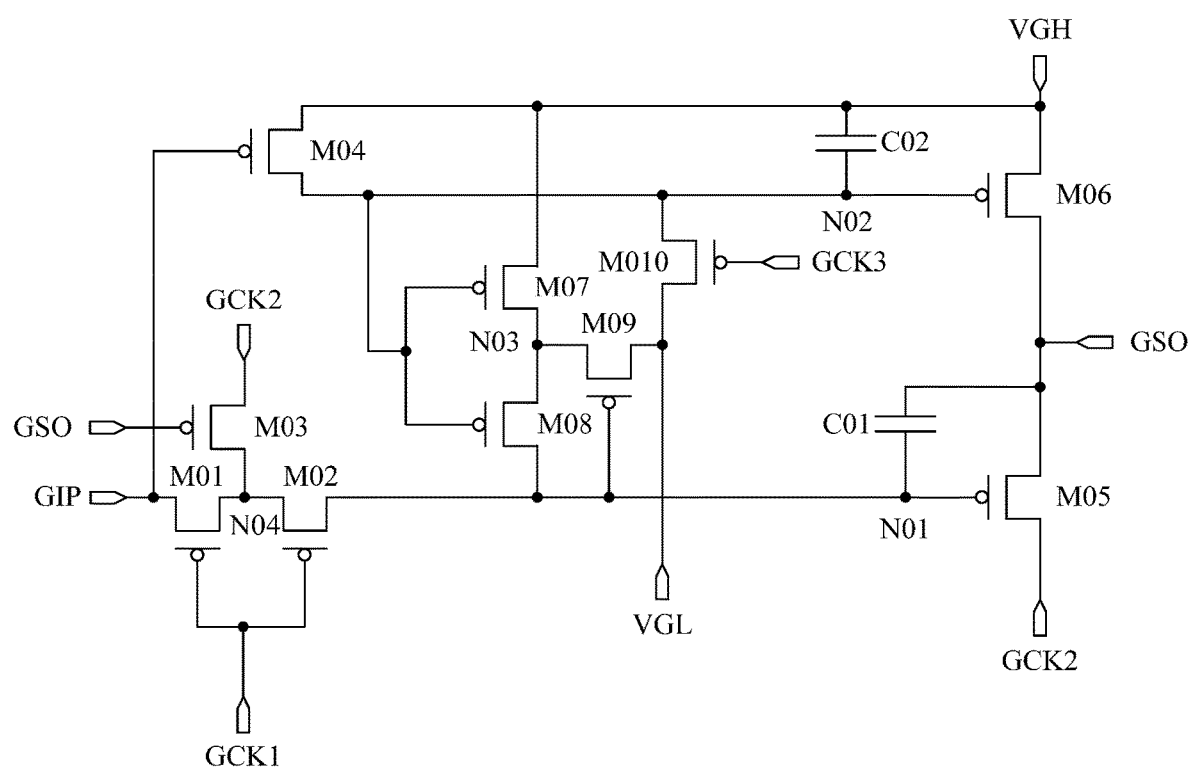
FIG. 1 is a schematic diagram of some structures of a shift register in the related art.
Figure 2:
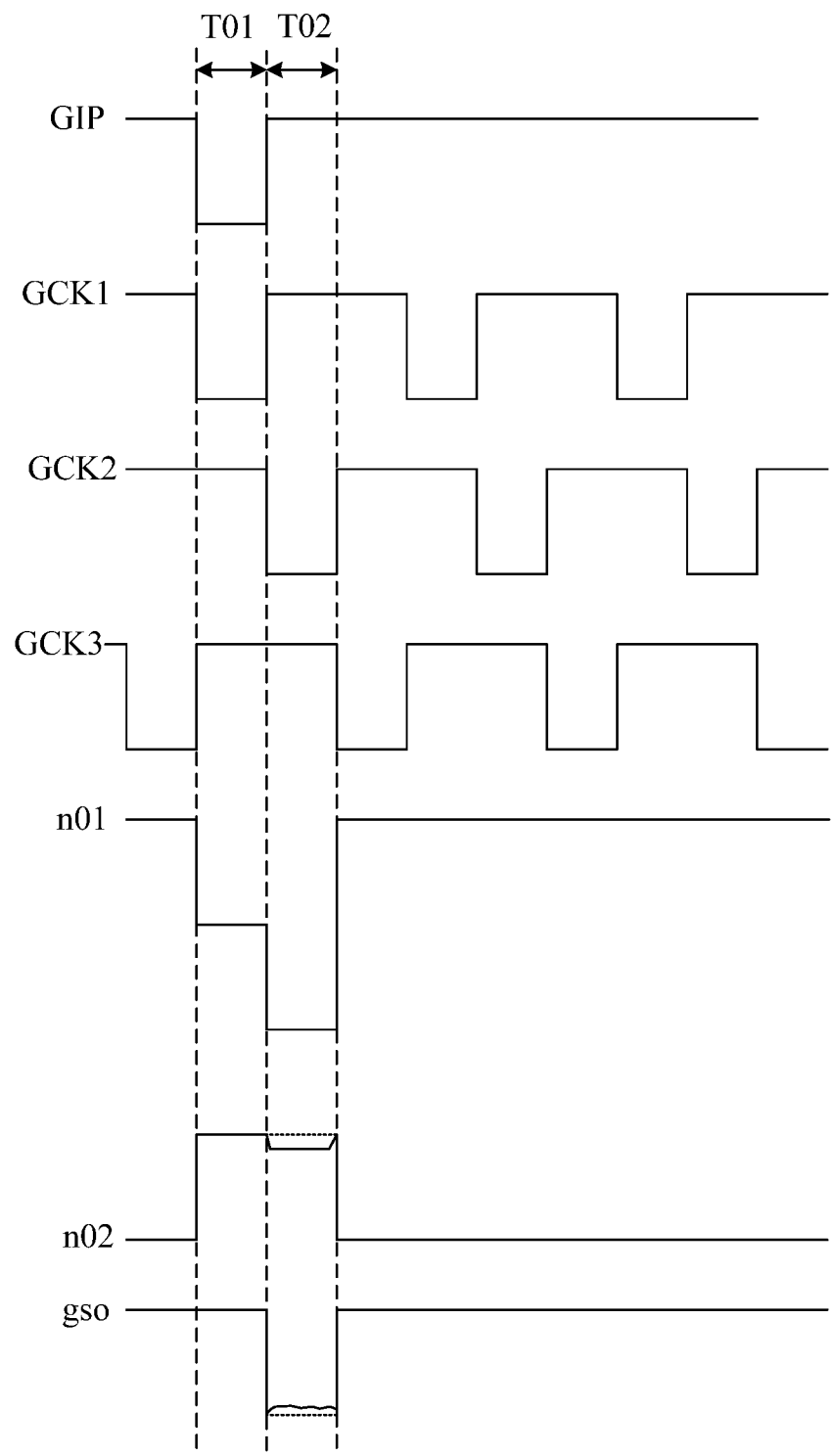
FIG. 2 is a timing diagram of some signals of the shift register in the related art.

As shown in FIG. 1, a shift register unit may include: transistors M01 to M010 and capacitors C01 to C02. The timing diagram of the corresponding signals is shown in FIG. 2, where GCK1 to GCK3 represent clock signals, GIP represents an input signal, n01 represents a signal of a node N01, n02 represents a signal of a node N02, and gso represents a signal of a drive output terminal GSO.

In an input phase T01, the clock signal GCK1 is at a low level, the transistors M01 and M02 are turned on, and the low-level input signal GIP is provided to the node N01 to control the transistors M05 and M09 to be turned on. The turned-on transistor M09 provides a low-level signal VGL to a node N03. The turned-on transistor M05 provides a high level of the clock signal GCK2 to the drive output terminal GSO, so that the signal gso output from the drive output terminal GSO is at the high level and controls the transistor M03 to be turned off. The clock signal GCK3 is at the high level, and the transistor M010 is turned off. The input signal GIP is at the low level, the transistor M04 is turned on, and the high-level signal VGH is provided to the node N02 to control the transistor M06 to be turned off.

In an output phase T02, the clock signal GCK1 is at the high level, and the transistors M01 and M02 are turned off. The clock signal GCK3 is at the high level, and the transistor M010 is turned off. The input signal GIP is at the high level, and the transistor M04 is turned off. Therefore, both the node N01 and the node N02 are in a floating state. Due to the function of the capacitor C01, the node N01 can be kept at the low level to control the transistors M05 and M09 to be turned on. The turned-on transistor M05 provides the low level of the clock signal GCK2 to the drive output terminal GSO, so that the signal gso output from the drive output terminal GSO is at the low level. Due to the bootstrap function of the capacitor C01, the level of the node N01 can be further pulled down to control the transistor M05 to be fully turned on as possible, to provide the low level of the clock signal GCK2 to the drive output terminal GSO, so that the signal gso output from the drive output terminal GSO is at the low level and controls the transistor M03 to be turned on. The turned-on transistor M03 can provide the low level of the signal gso to the node N04. Due to the function of the capacitor C02, the node N02 can be kept at the high level to control the transistor M06 to be turned off.

However, in the above shift register unit, since the signal received by the gate of the transistor M04 is the input signal GIP, the transistor M04 can only be turned on in the input phase t01 and cannot be turned on in other phases. Especially in the output phase t02, the node N02 does not input a high-level signal, but the node N02 is held by the capacitor C02 to be at the high level. However, due to the leakage current of the transistor M010, the high level of the node N02 held by the capacitor C02 will be pulled down (as shown in FIG. 2, the part shown by the solid line in the signal n01 is the actual level of the node N02 in the phase t02, and the part shown by the dotted line is the ideal level of the node N02 in the phase t02), so that the signal gso output by the drive output terminal GSO is unstable (as shown in FIG. 2, the part shown by the solid line in the signal gso is the actual level of the signal gso in the phase 102, and the part shown by the dotted line is the ideal level of the signal gso in the phase t02).

Although the capacitor C02 is set in the above shift register unit, the stability of the node N02 can only be maintained by the voltage component $c_{02}/(c_{02}+c_{gd(M06)}+c_{N02(others)})$ of the capacitor C02 in practical applications. The larger the voltage component is, the more stable the node N02 is. In order to ensure that the node N02 is not pulled down, the capacitor C02 can be set to be relatively large. However, for example, when the width of the channel region of the transistor M06 is 400 um and the capacitance of the capacitor C02 is 500 fF, the node N02 still jumps down by about IV. As shown in FIG. 2, the node N02 may jump from 7V to 4.9V due to the effect of the output jump in the output phase T02. With the increase of the capacitor C02, the downward adjustment range of the node N02 may decrease, but the level of the node N02 cannot reach 7V. Therefore, although the capacitor C02 is set to be relatively large, it is impossible completely keep the node N02 from not being pulled down, and the shift register unit may also occupy a relatively large space.

In order to solve above problems, an embodiment of the disclosure provides a shift register unit, which can improve the stability of nodes.

Figure 3:
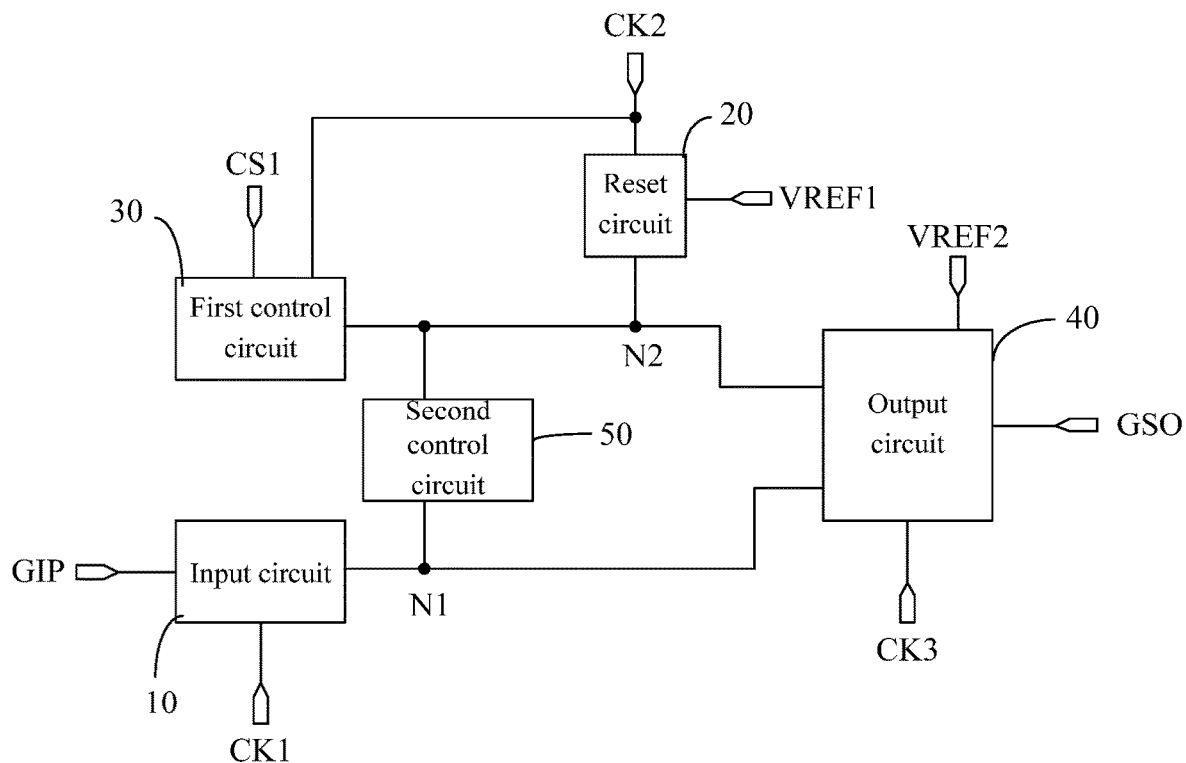
FIG. 3 is a schematic diagram of some structures of a shift register according to an embodiment of the disclosure.

In an embodiment of the disclosure, as shown in FIG. 3, the shift register unit may include: an input circuit 10, a reset circuit 20, a first control circuit 30 and an output circuit 40.

Here, the input circuit 10 is configured to provide an input signal GIP to a first node N1 in response to a first clock signal CK1. The reset circuit 20 is configured to provide a first reference signal VREF1 to a second node N2 in response to a second clock signal CK2. The first control circuit 30 is configured to provide the second clock signal CK2 to the second node N2 in response to a first control signal CS1. The output circuit 40 is configured to provide a third clock signal CK3 to a drive output terminal GSO in response to a signal of the first node N1, and provide a second reference signal VREF2 to the drive output terminal GSO in response to a signal of the second node N2. Moreover, a duration of an active level of the first control signal CS1 is longer than a duration of an active level of a signal of the drive output terminal GSO.

In the shift register unit provided by an embodiment of the disclosure, by making the duration of the active level of the first control signal longer than the duration of the active level of the signal of the drive output terminal, the conduction duration of the first control circuit can be increased, that is, the duration in which the second clock signal is provided to the second node is increased, to stabilize the level of the second node through the input signal. In this way, the level stability of the second node can be realized without additional setting of a large capacitor, which not only improves the output stability, but also reduces the occupied area.

Figure 4:
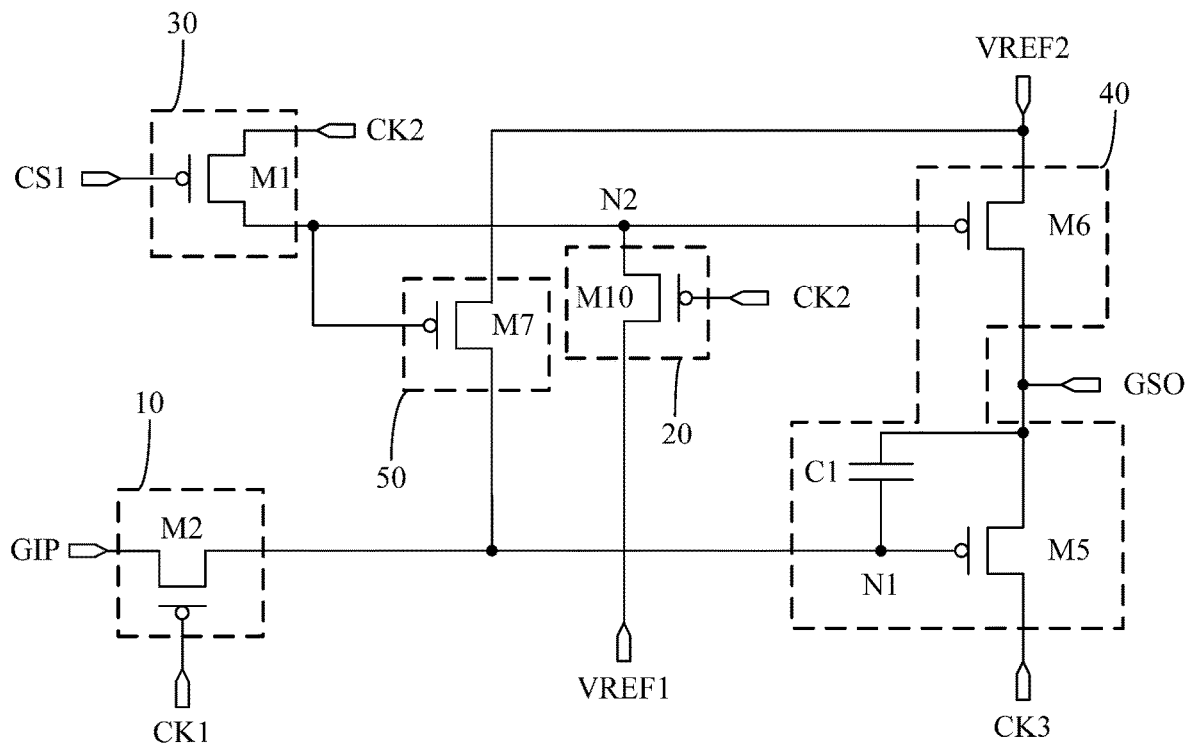
FIG. 4 is a schematic diagram of other structures of the shift register according to an embodiment of the disclosure.

In some embodiments of the disclosure, as shown in FIG. 4, the first control circuit 30 includes a first transistor M1. A control electrode of the first transistor M1 is configured to receive the first control signal CS1, a first electrode of the first transistor M1 is configured to receive the second clock signal CK2, and a second electrode of the first transistor M1 is coupled to the second node N2.

For example, the first transistor M1 is turned on under control of an active level of the first control signal CS1, and is turned off under control of an inactive level of the first control signal CS1. For example, the first transistor M1 is a P-type transistor, so the active level of the first control signal CS1 is low level, and the inactive level is high level. Alternatively, the first transistor M1 is an N-type transistor, so the active level of the first control signal CS1 is high level, and the inactive level is low level. In practical applications, the specific implementation of the first transistor may be determined according to requirements of practical applications, which is not limited here.

In some embodiments of the disclosure, as shown in FIG. 4, the input circuit 10 may include a second transistor M2. A control electrode of the second transistor M2 is configured to receive the first clock signal CK1, a first electrode of the second transistor M2 is configured to receive the input signal GIP, and a second electrode of the second transistor M2 is coupled to the first node N1.

For example, the second transistor M2 is turned on under control of an active level of the first clock signal CK1, and is turned off under control of an inactive level of the first clock signal CK1. For example, the second transistor M2 is a P-type transistor, so the active level of the first clock signal CK1 is low level, and the inactive level is high level. Alternatively, the second transistor M2 is an N-type transistor, so the active level of the first clock signal CK1 is high level, and the inactive level is low level. In practical applications, the specific implementation of the second transistor may be determined according to requirements of practical applications, which is not limited here.

In some embodiments of the disclosure, as shown in FIG. 4, the output circuit 40 includes: a fifth transistor M5, a sixth transistor M6 and a first capacitor C1. A control electrode of the fifth transistor M5 is coupled to the first node N1, a first electrode of the fifth transistor M5 is configured to receive the third clock signal CK3, and a second electrode of the fifth transistor M5 is coupled to the drive output terminal GSO. A control electrode of the sixth transistor M6 is coupled to the second node N2, a first electrode of the sixth transistor M6 is configured to receive the second reference signal VREF2, and a second electrode of the sixth transistor M6 is coupled to the drive output terminal GSO. A first electrode plate of the first capacitor C1 is coupled to the first node N1, and a second electrode plate of the first capacitor C1 is coupled to the drive output terminal GSO.

For example, the fifth transistor M5 is turned on under the control of the active level of the signal of the first node N1, and is turned off under the control of the inactive level of the signal of the first node N1. For example, the fifth transistor M5 is a P-type transistor, so the active level of the signal of the first node N1 is low level, and the inactive level is high level. Alternatively, the fifth transistor M5 is an N-type transistor, so the active level of the signal of the first node N1 is high level, and the inactive level is low level. In practical applications, the specific implementation of the fifth transistor may be determined according to requirements of practical applications, which is not limited here.

For example, the sixth transistor M6 is turned on under the control of the active level of the signal of the second node N2, and is turned off under the control of the inactive level of the signal of the second node N2. For example, the sixth transistor M6 is a P-type transistor, so the active level of the signal of the second node N2 is low level, and the inactive level is high level. Alternatively, the sixth transistor M6 is an N-type transistor, so the active level of the signal of the second node N2 is high level, and the inactive level is low level. In practical applications, the specific implementation of the sixth transistor may be determined according to requirements of practical applications, which is not limited here.

In some embodiments of the disclosure, as shown in FIG. 4, the shift register unit further includes: a second control circuit 50. The second control circuit 50 is configured to provide the second reference signal VREF2 to the first node N1 in response to the signal of the second node N2. For example, the second control circuit 50 includes: a seventh transistor M7, where a control electrode of the seventh transistor M7 is coupled to the second node N2, a first electrode of the seventh transistor M7 is configured to receive the second reference signal VREF2, and a second electrode of the seventh transistor M7 is coupled to the first node N1.

For example, the seventh transistor M7 is turned on under the control of the active level of the signal of the second node N2, and is turned off under the control of the inactive level of the signal of the second node N2. For example, the seventh transistor M7 is a P-type transistor, so the active level of the signal of the second node N2 is low level, and the inactive level is high level. Alternatively, the seventh transistor M7 is an N-type transistor, so the active level of the signal of the second node N2 is high level, and the inactive level is low level. In practical applications, the specific implementation of the seventh transistor may be determined according to requirements of practical applications, which is not limited here.

In some embodiments of the disclosure, as shown in FIG. 4, the reset circuit 20 includes a tenth transistor M10. A control electrode of the tenth transistor M10 is configured to receive the second clock signal CK2, a first electrode of the tenth transistor M10 is configured to receive the first reference signal VREF1, and a second electrode of the tenth transistor M10 is coupled the second node N2.

For example, the tenth transistor M10 is turned on under the control of the active level of the second clock signal CK2, and is turned off under the control of the inactive level of the second clock signal CK2. For example, the tenth transistor M10 is a P-type transistor, so the active level of the second clock signal CK2 is low level, and the inactive level is high level. Alternatively, the tenth transistor M10 is an N-type transistor, so the active level of the second clock signal CK2 is high level, and the inactive level is low level. In practical applications, the specific implementation of the tenth transistor may be determined according to requirements of practical applications, which is not limited here.

Figure 5:
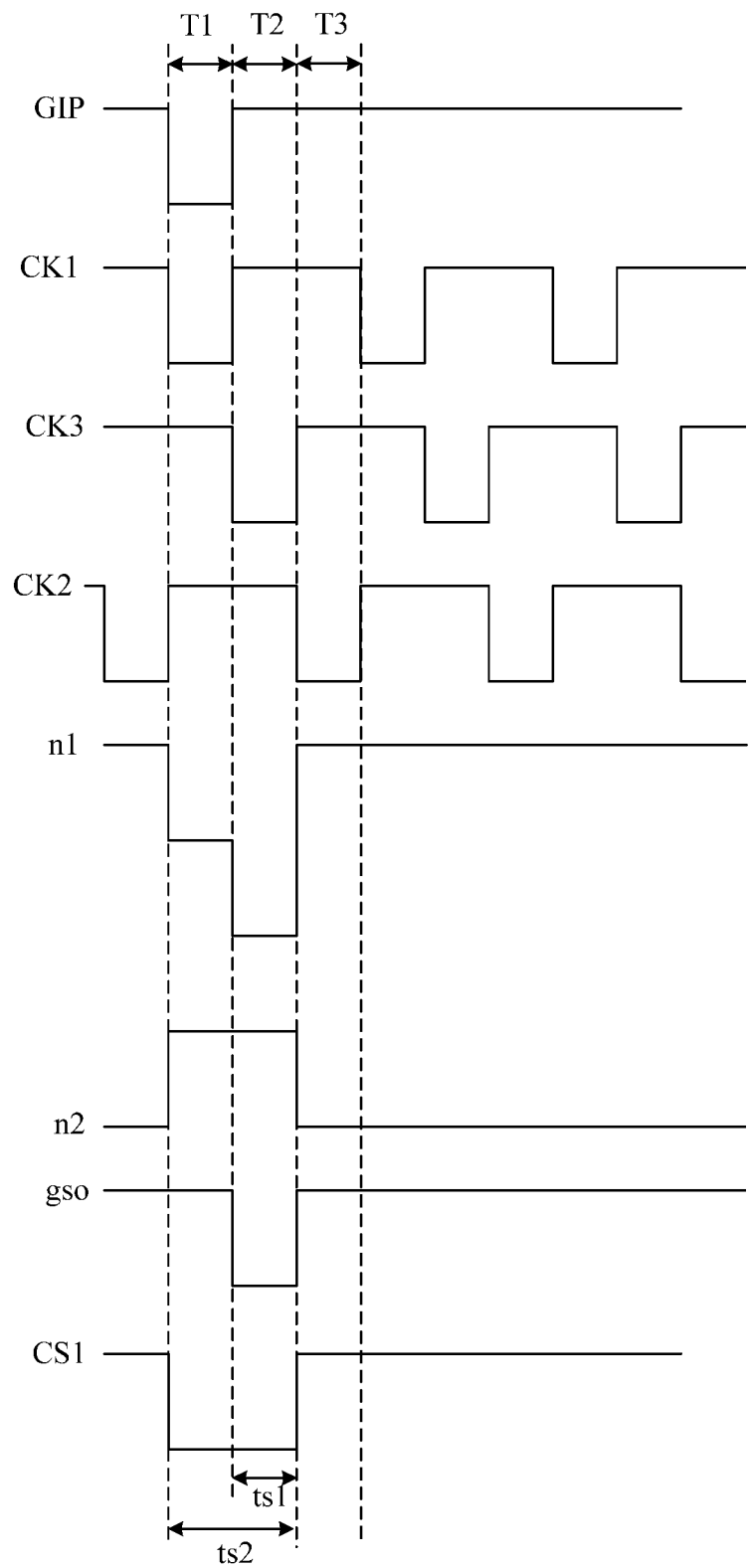
FIG. 5 is a timing diagram of some signals of the shift register according to an embodiment of the disclosure.

In some embodiments of the disclosure, a signal timing diagram corresponding to the shift register unit shown in FIG. 4 may be shown in FIG. 5. GIP represents the input signal, CK1 represents the first clock signal, CK2 represents the second clock signal, CK3 represents the third clock signal, n1 represents the signal of the first node N1, n2 represents the signal of the second node N2, gso represents the signal of the drive output terminal GSO, and CS1 represents the first control signal. Here, when the active level is low level, the duration ts2 of the low level of the first control signal CS1 is longer than the duration ts1 of the low level of the signal gso of the drive output terminal GSO. For example, the duration ts2 of the low level of the first control signal CS1 may be approximately equal to twice the duration ts1 of the low level of the signal gso of the drive output terminal GSO. Alternatively, when the active level is high level, the duration ts2 of the high level of the first control signal CS1 is greater than the duration ts1 of the high level of the signal gso of the drive output terminal GSO. For example, the duration ts2 of the high level of the first control signal CS1 may be approximately equal to twice the duration ts1 of the high level of the signal gso of the drive output terminal GSO. In practical applications, the specific case may be determined according to requirements of practical applications, which is not limited here.

It should be noted that, in the actual process, due to limitations of process conditions or other factors, the above-mentioned equal relationship cannot be completely equal, and there may be some deviations. Therefore, the above-mentioned equal relationship belongs to the protection scope of the disclosure as long as the above-mentioned equal relationship approximately satisfies the above condition. For example, the above-mentioned equal relationship may be equal within an allowable range of error.

In a specific implementation, the control electrode of the transistor may be used as a gate. Moreover, according to the signal flow direction, the first electrode of the transistor may be used as a source, and the second electrode of the transistor may be used as a drain: or, the first electrode may be used as a drain, and the second electrode may be used as a source, which are not distinguished here.

It should be noted that the transistor mentioned in above embodiments of the disclosure may be a TFT or a Metal Oxide Semiconductor (MOS), which is not limited herein.

In order to simplify the manufacturing process, during a specific implementation, all the transistors may be P-type transistors, as shown in FIG. 4, in embodiments of the disclosure. Of course, all the transistors may also be N-type transistors, which is not limited here.

The above is just an example to illustrate the specific structure of the shift register unit provided by embodiments of the disclosure. In a specific implementation, the specific structures of the above-mentioned circuits are not limited to the above-mentioned structures provided by embodiments of the disclosure, and may also be other structures known to those skilled in the art, which are not limited here.

Figure 6:
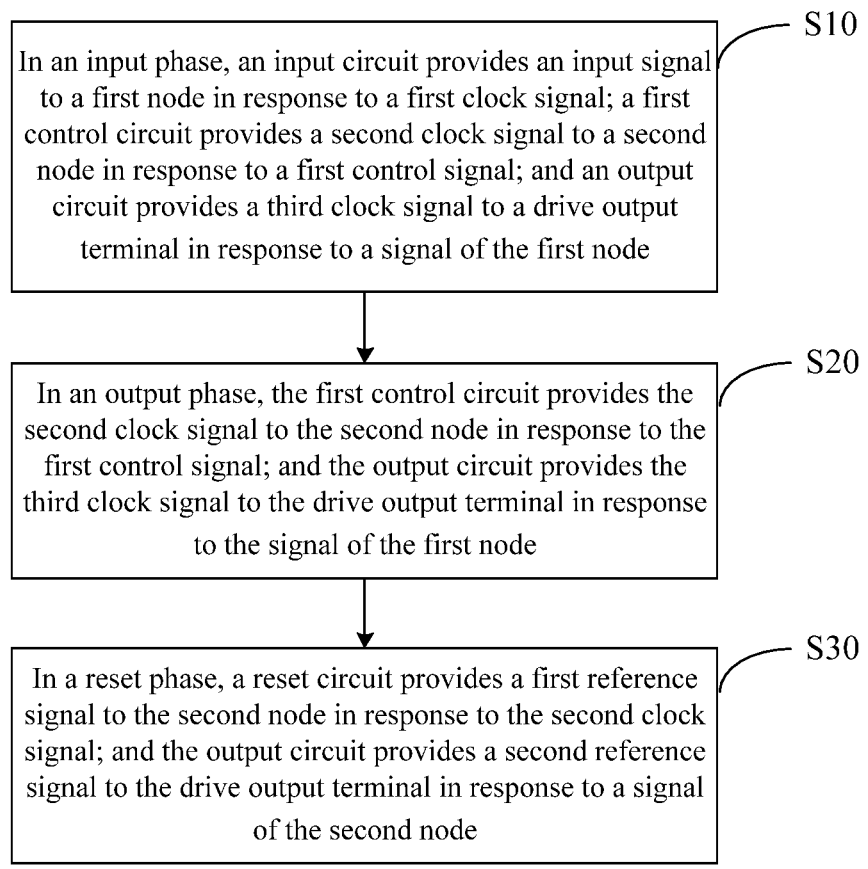
FIG. 6 is some flow charts of a driving method according to an embodiment of the disclosure.

An embodiment of the disclosure further provides a driving method for a shift register unit, as shown in FIG. 6, which may include following steps.

S10. In an input phase: an input circuit provides an input signal to a first node in response to a first clock signal: a first control circuit provides a second clock signal to a second node in response to a first control signal; and an output circuit provides a third clock signal to a drive output terminal in response to a signal of the first node.

S20. In an output phase: the first control circuit provides the second clock signal to the second node in response to the first control signal; and the output circuit provides the third clock signal to the drive output terminal in response to the signal of the first node.

S30. In a reset phase: a reset circuit provides a first reference signal to the second node in response to the second clock signal; and the output circuit provides a second reference signal to the drive output terminal in response to a signal of the second node.

In the driving method provided by an embodiment of the disclosure, by making the duration of the active level of the first control signal longer than the duration of the active level of the signal of the drive output terminal, the conduction duration of the first control circuit can be increased, that is, the duration in which the second clock signal is provided to the second node is increased, to stabilize the level of the second node through the input signal. In this way, the level stability of the second node can be realized without additional setting of a large capacitor. Therefore, not only the output stability can be improved, but also the occupied area can be reduced.

In some embodiments of the disclosure, when the shift register unit further includes a second control circuit, the second control circuit may provide the second reference signal to the first node in response to the signal of the second node in the reset phase.

Taking the shift register unit shown in FIG. 4 as an example, the working process of the shift register unit provided by embodiments of the disclosure will be described below in conjunction with the signal timing diagram shown in FIG. 5.

The input phase T1, the output phase T2 and the reset phase T3 in the signal timing diagram shown in FIG. 5 are selected. It should be noted that the signal timing diagram shown in FIG. 5 is only the working process of a certain shift register unit within one frame. The working process of the shift register unit in other frames is basically the same as the working process in this frame, and will not be repeated here.

In the input phase T1, the first clock signal CK1 is at the low level, the second transistor M2 is turned on, and the low-level input signal GIP is provided to the first node N1 to control the fifth transistor M5 to be turned on. The turned-on fifth transistor M5 provides the high level of the third clock signal CK3 to the drive output terminal GSO, so that the signal gso output from the drive output terminal GSO is at the high level. The second clock signal CK2 is at the high level, and the tenth transistor M10 is turned off. The first control signal CS1 is at the low level, the first transistor M1 is turned on, and the second clock signal CK2 at the high level is provided to the second node N2 to control the sixth transistor M6 and the seventh transistor M7 to be turned off.

In the output phase T2, the first clock signal CK1 is at the high level, and the second transistor M2 is turned off. The second clock signal CK2 is at the high level, and the tenth transistor M10 is turned off. The first control signal CS1 is at the low level, the first transistor M1 is turned on, and the second clock signal CK2 at the high level is provided to the second node N2 to control the sixth transistor M6 and the seventh transistor M7 to be turned off. Therefore, the first node N1 is in the floating state. Due to the function of the first capacitor C1, the first node N1 can be kept at the low level to control the fifth transistor M5 to be turned on. The turned-on fifth transistor M5 provides the low level of the third clock signal CK3 to the drive output terminal GSO, so that the signal gso output from the drive output terminal GSO is at the low level. Due to the bootstrap effect of the first capacitor C1, the level of the first node N1 can be further pulled down to control the fifth transistor M5 to be fully turned on as possible, to provide the low level of the third clock signal CK3 to the drive output terminal GSO, so that the signal gso output from the drive output terminal GSO is at the low level.

In the reset phase T3, the first clock signal CK1 is at the high level, and the second transistor M2 is turned off. The first control signal CS1 is at the high level, and the first transistor M1 is turned off. The second clock signal CK2 is at the low level, the tenth transistor M10 is turned on, and the first reference signal VREF1 at the low level is provided to the second node N2 to control the sixth transistor M6 and the seventh transistor M7 to be turned on. The turned-on seventh transistor M7 provides the second reference signal VREF2 at the high level to the first node N1 to control the fifth transistor M5 to be turned off. The turned-on sixth transistor M6 provides the second reference signal VREF2 at the high level to the drive output terminal GSO, so that the signal gso output from the drive output terminal GSO is at the high level.

It should be noted that the first transistor M1 is turned on in both the input phase T1 and the output phase T2 under the control of the first control signal CS1, and the second clock signal CK2 at the high level can be provided to the second node N2 in these two phases, to prevent the second node N2 from floating in these two phases, so that the second node N2 can be stabilized (for example, at 7V) in the output phase. Moreover, since the second clock signal CK2 at the high level is provided to the second node N2 in both the input phase T1 and the output phase T2, it is not necessary to arrange a capacitor at the control electrode of the sixth transistor M6, thus further reducing the occupied space of the shift register unit. For example, when no capacitor is arranged at the control electrode of the sixth transistor M6, the width of the channel region of the sixth transistor M6 may be greater than 50 um or 100 um, that is, the stable output of the shift register unit can be realized.

Figure 7:
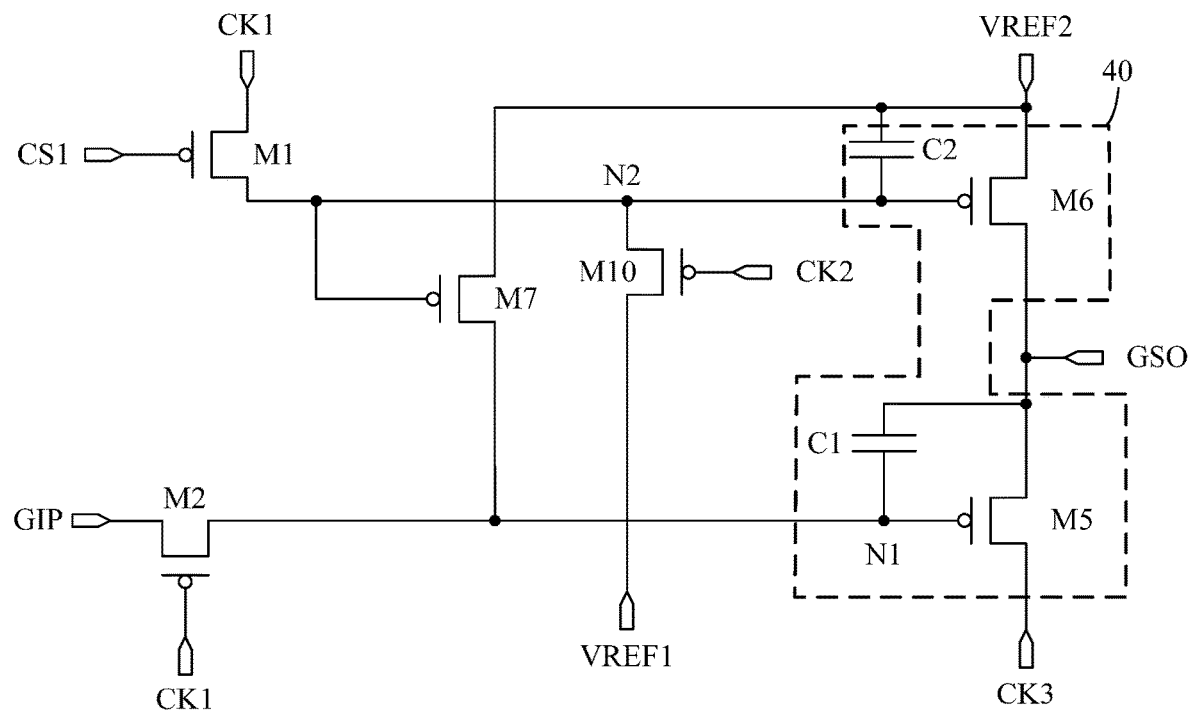
FIG. 7 is a schematic diagram of yet other structures of the shift register according to an embodiment of the disclosure.

An embodiment of the disclosure provides a schematic diagram of other structures of the shift register unit, as shown in FIG. 7, which is modified for implementations in the above-mentioned embodiments. Only differences between this embodiment and the above embodiments are illustrated below, and similarities thereof are not repeated here.

In some embodiments of the disclosure, as shown in FIG. 7, the output circuit 40 further includes: a second capacitor C2. A first electrode plate of the second capacitor C2 is coupled to the second node N2, and a second electrode plate of the second capacitor C2 is configured to receive the second reference signal VREF2. Thus, the level of the second node N2 can be further stabilized through the second capacitor C2.

It should be noted that the signal timing diagram corresponding to the shift register unit shown in FIG. 7 may be shown in FIG. 5. In addition, the working process of the shift register unit shown in FIG. 7 in combination with the signal timing shown in FIG. 5 can refer to the working process of the above shift register unit, which will not be repeated here.

It should be noted that the signal stability of the second node N2 can be further improved by setting the second capacitor C2. In practical applications, the width of the channel region of the sixth transistor M6 may be less than 400 um, and the capacitance of the second capacitor may only be 50fF-200fF, so that the output of the shift register unit can be stabilized.

Figure 8:
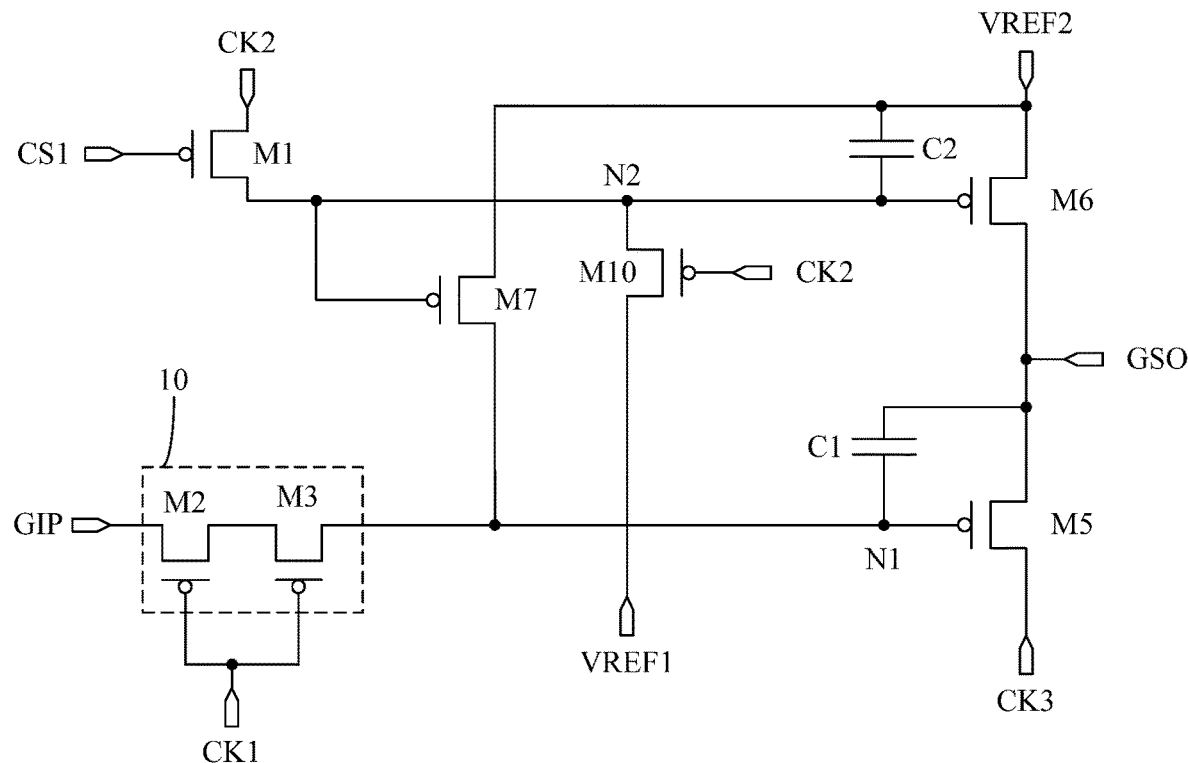
FIG. 8 is a schematic diagram of yet other structures of the shift register according to an embodiment of the disclosure.

An embodiment of the disclosure provides a schematic diagram of vet other structures of the shift register unit, as shown in FIG. 8, which is modified for implementations in the above-mentioned embodiments. Only differences between this embodiment and the above embodiments are illustrated below; and similarities thereof are not repeated here.

In some embodiments of the disclosure, as shown in FIG. 8, the input circuit 10 further includes a third transistor M3; and the second electrode of the second transistor M2 is coupled to the first node N1 through the third transistor M3. A control electrode of the third transistor M3 is configured to receive the first clock signal CK1, a first electrode of the third transistor M3 is coupled to the second electrode of the second transistor M2, a second electrode of the third transistor M3 is coupled to the first Node N1.

For example, the third transistor M3 is turned on under the control of the active level of the first clock signal CK1, and is turned off under the control of the inactive level of the first clock signal CK1. For example, the third transistor M3 is a P-type transistor, so the active level of the first clock signal CK1 is low level, and the inactive level is high level. Alternatively, the third transistor M3 is an N-type transistor, so the active level of the first clock signal CK1 is high level, and the inactive level is low level. In practical applications, the specific implementation of the third transistor may be determined according to requirements of practical applications, which is not limited here.

It should be noted that the signal timing diagram corresponding to the shift register unit shown in FIG. 8 may be shown in FIG. 5. Moreover, the third transistor M3 is turned on under the control of the first clock signal CK1 in the input phase T1, so that the low-level input signal GIP can be provided to the first node N1 in conjunction with the turned-on second transistor M2. The third transistor M3 is turned off under the control of the first clock signal CK1 in the output phase T2 and the reset phase T3. In addition, the other working process of the shift register unit shown in FIG. 8 in combination with the signal timing shown in FIG. 5 can refer to the working process of the above shift register unit, which will not be repeated here.

It should be noted that the arrangement of two transistors in the input circuit 10 can reduce the influence of the leakage current of the first node N1 on the signal of the first node N1, and improve the signal stability of the first node N1.

Figure 9:
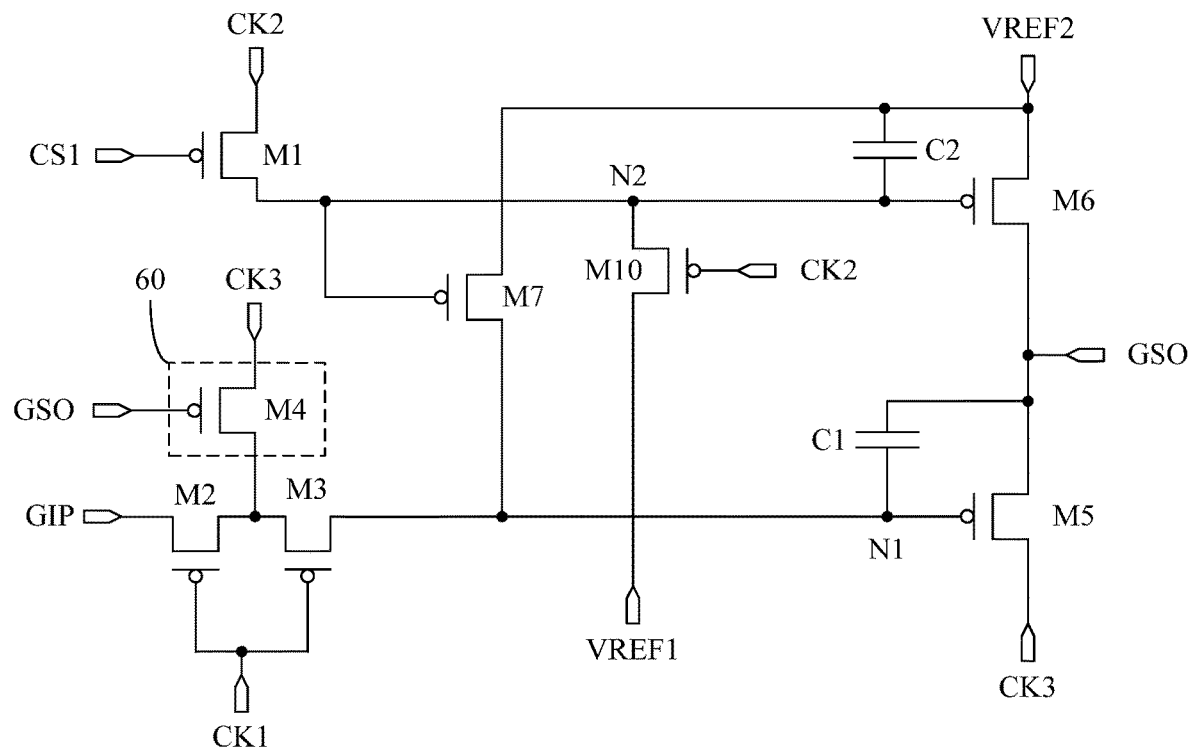
FIG. 9 is a schematic diagram of yet other structures of the shift register according to an embodiment of the disclosure.

An embodiment of the disclosure provides a schematic diagram of yet other structures of the shift register unit, as shown in FIG. 9, which is modified for the implementations in the above-mentioned embodiments. Only the differences between this embodiment and the above embodiments are illustrated below; and the similarities thereof are not repeated here.

In some embodiments of the disclosure, as shown in FIG. 9, the shift register unit further includes: a first noise reduction circuit 60. The first noise reduction circuit 60 is configured to provide the third clock signal CK3 to the first electrode of the third transistor M3 in response to the signal of the drive output terminal GSO. For example, the first noise reduction circuit 60) includes: a fourth transistor M4. A control electrode of the fourth transistor M4 is coupled to the drive output terminal GSO, a first electrode of the fourth transistor M4 is configured to receive the third clock signal CK3, and a second electrode of the fourth transistor M4 is coupled to the first electrode of the third transistor M3.

For example, the fourth transistor M4 is turned on under the control of the active level of the signal of the drive output terminal GSO, and is turned off under the control of the inactive level of the signal of the drive output terminal GSO. For example, the fourth transistor M4 is a P-type transistor, so the active level of the signal of the drive output terminal GSO is low level, and the inactive level is high level. Alternatively, the fourth transistor M4 is an N-type transistor, so the active level of the signal of the drive output terminal GSO is high level, and the inactive level is low level. In practical applications, the specific implementation of the fourth transistor may be determined according to requirements of practical applications, which is not limited here.

In some embodiments of the disclosure, when the shift register unit further includes a first noise reduction circuit, the first noise reduction circuit may provide the third clock signal to the first electrode of the third transistor in response to the signal of the drive output terminal in the output phase.

It should be noted that the signal timing diagram corresponding to the shift register unit shown in FIG. 9 may be shown in FIG. 5. Moreover, the fourth transistor M4 is turned on under the control of the signal gso of the drive output terminal GSO in the output phase T2, and provides the low level of the third clock signal CK3 to the first electrode of the third transistor M3. The fourth transistor M4 is turned off under the control of the signal gso of the drive output terminal GSO in the input phase T1 and the reset phase T3. In addition, the other working process of the shift register unit shown in FIG. 9 in combination with the signal timing shown in FIG. 5 can refer to the working process of the above shift register unit, which will not be repeated here.

It should be noted that the low level of the third clock signal CK3 can be provided to the first electrode of the third transistor M3 in the output phase by setting the first noise reduction circuit 60), so that the influence of the leakage current of the first node N1 on the signal of the first node N1 can be further reduced, and the signal stability of the first node N1 can be further improved.

Figure 10:
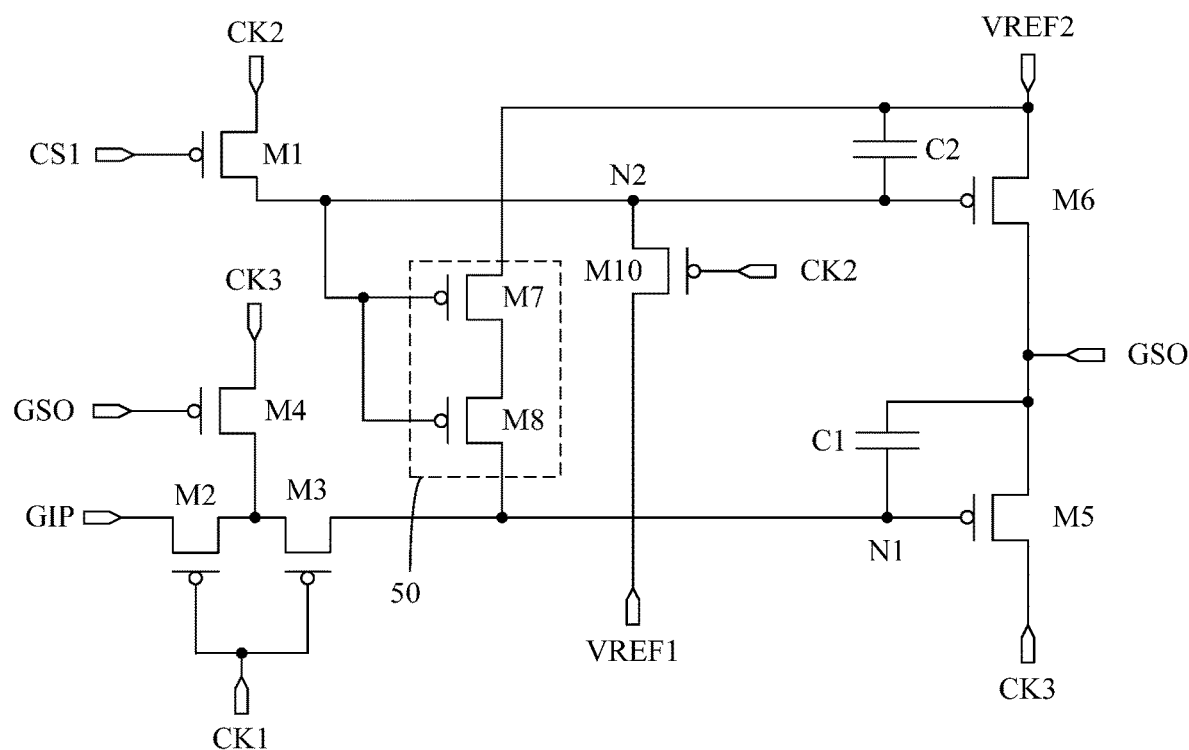
FIG. 10 is a schematic diagram of yet other structures of the shift register according to an embodiment of the disclosure.

An embodiment of the disclosure provides a schematic diagram of vet other structures of the shift register unit, as shown in FIG. 10, which is modified for the implementations in the above-mentioned embodiments. Only the differences between this embodiment and the above embodiments are illustrated below, and the similarities thereof are not repeated here.

In some embodiments of the disclosure, as shown in FIG. 10, the second control circuit 50) may further include: an eighth transistor M8; and the second electrode of the seventh transistor M7 is coupled to the first node N1 through the eighth transistor M8. A control electrode of the eighth transistor M8 is coupled to the second node N2, a first electrode of the eighth transistor M8 is coupled to the second electrode of the seventh transistor M7, and a second electrode of the eighth transistor M8 is coupled to the first node N1.

For example, the eighth transistor M8 is turned on under the control of the active level of the signal of the second node N2, and is turned off under the control of the inactive level of the signal of the second node N2. For example, the eighth transistor M8 is a P-type transistor, so the active level of the signal of the second node N2 is low level, and the inactive level is high level. Alternatively, the eighth transistor M8 is an N-type transistor, so the active level of the signal of the second node N2 is high level, and the inactive level is low level. In practical applications, the specific implementation of the eighth transistor may be determined according to requirements of practical applications, which is not limited here.

It should be noted that the signal timing diagram corresponding to the shift register unit shown in FIG. 10 may be shown in FIG. 5. Moreover, the eighth transistor M8 is turned on under the control of the level of the second node N2 in the reset phase T3, and provides the second reference signal VREF2 at the high level to the first node N1 in combination with the turned-on seventh transistor M7. The eighth transistor M8 is turned off under the control of the level of the second node N2 in the input phase T1 and the output phase T2. In addition, the other working process of the shift register unit shown in FIG. 10 in combination with the signal timing shown in FIG. 5 can refer to the working process of the above shift register unit, which will not be repeated here.

It should be noted that the arrangement of the eighth transistor M8 can reduce the influence of the leakage current of the first node N1 on the signal of the first node N1, and further improve the signal stability of the first node N1.

Figure 11:
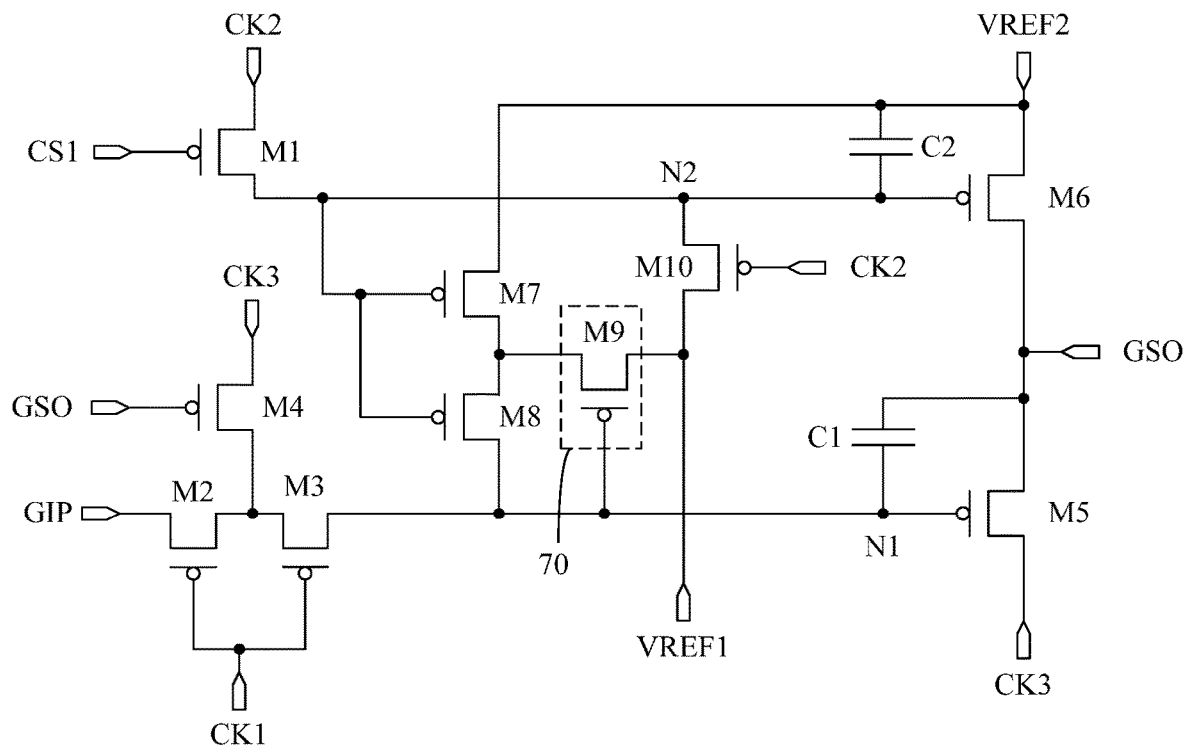
FIG. 11 is a schematic diagram of yet other structures of the shift register according to an embodiment of the disclosure.

An embodiment of the disclosure provides a schematic diagram of yet other structures of the shift register unit, as shown in FIG. 11, which is modified for the implementations in the above-mentioned embodiments. Only the differences between this embodiment and the above embodiments are illustrated below; and the similarities thereof are not repeated here.

In some embodiments of the disclosure, as shown in FIG. 11, the shift register unit further includes: a second noise reduction circuit 70. The second noise reduction circuit 70 is configured to provide the first reference signal VREF1 to the first electrode of the eighth transistor M8 in response to the signal of the first node N1. For example, the second noise reduction circuit 70) includes: a ninth transistor M9. A control electrode of the ninth transistor M9 is coupled to the first node N1, a first electrode of the ninth transistor M9 is configured to receive the first reference signal VREF1, and a second electrode of the ninth transistor M9 is coupled to the first electrode of the eighth transistor M8.

For example, the ninth transistor M9 is turned on under the control of the active level of the signal of the first node N1, and is turned off under the control of the inactive level of the signal of the first node N1. For example, the ninth transistor M9 is a P-type transistor, so the active level of the signal of the first node N1 is low level, and the inactive level is high level. Alternatively, the ninth transistor M9 is an N-type transistor, so the active level of the signal of the first node N1 is high level, and the inactive level is low level. In practical applications, the specific implementation of the ninth transistor may be determined according to requirements of practical applications, which is not limited here.

In some embodiments of the disclosure, when the shift register unit further includes a second noise reduction circuit, the second noise reduction circuit may provide the first reference signal to the first electrode of the eighth transistor in response to the signal of the first node in the input phase; and the second noise reduction circuit may provide the first reference signal to the first electrode of the eighth transistor in response to the signal of the first node in the output phase.

It should be noted that the signal timing diagram corresponding to the shift register unit shown in FIG. 11 may be shown in FIG. 5. Moreover, the ninth transistor M9 is turned on under the control of the level of the first node N1 in the input phase T1 and the output phase T2, and provides the first reference signal VREF1 at the low level to the first electrode of the eighth transistor M8. The ninth transistor M9 is turned off under the control of the level of the first node N1 in the reset phase T3. In addition, the other working process of the shift register unit shown in FIG. 11 in combination with the signal timing shown in FIG. 5 can refer to the working process of the above shift register unit, which will not be repeated here.

It should be noted that the arrangement of the ninth transistor M9 can further reduce the influence of the leakage current of the first node N1 on the signal of the first node N1, and further improve the signal stability of the first node N1.

Figure 12A:
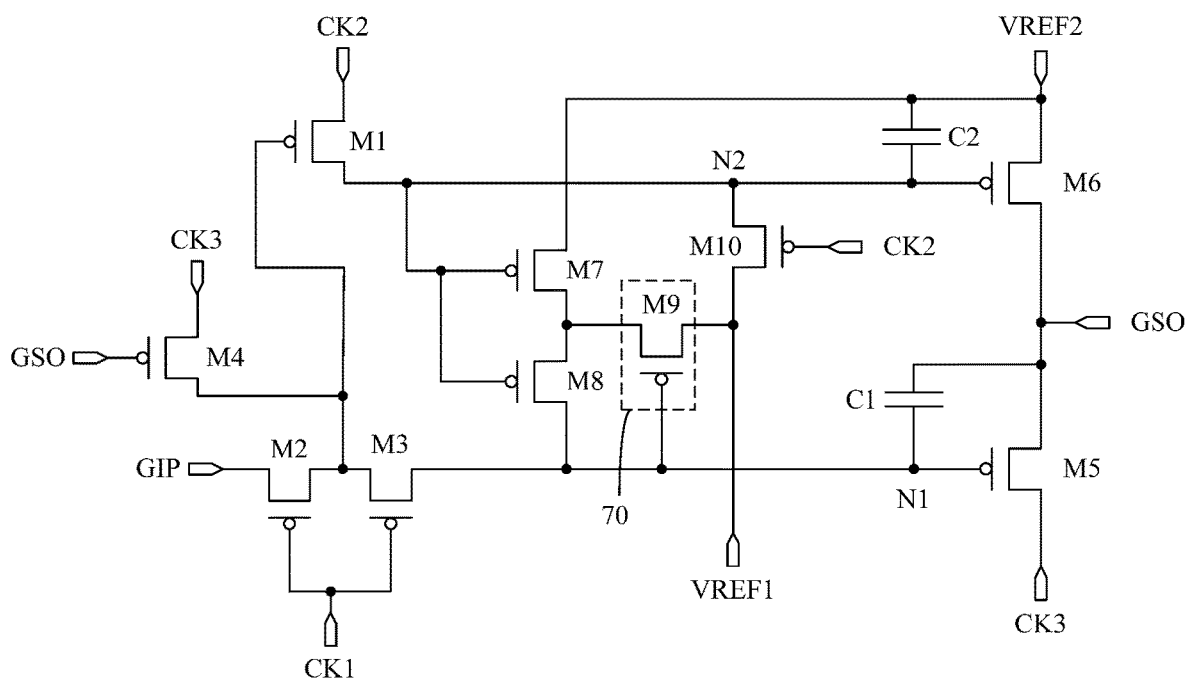
FIG. 12A is a schematic diagram of yet other structures of the shift register according to an embodiment of the disclosure.

An embodiment of the disclosure provides a schematic diagram of yet other structures of the shift register unit, as shown in FIG. 12A, which is modified for the implementations in the above-mentioned embodiments. Only the differences between this embodiment and the above embodiments are illustrated below, and the similarities thereof are not repeated here.

In some embodiments of the disclosure, as shown in FIG. 12A, the first control circuit 30 is coupled to the first electrode of the third transistor M3, and a signal of the first electrode of the third transistor M3 is the first control signal CS1. The control electrode of the first transistor M1 is coupled to the first electrode of the third transistor M3.

Figure 13:
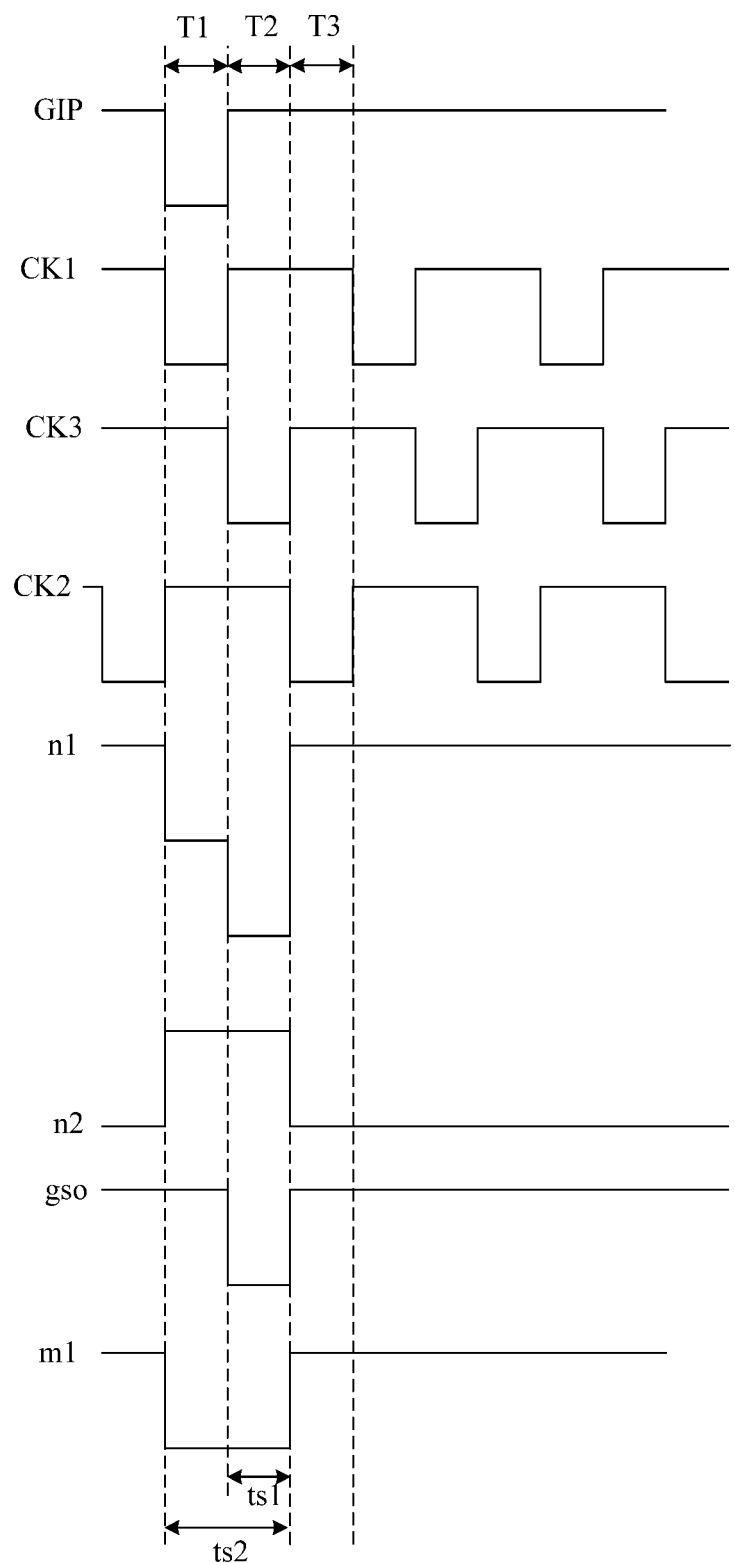
FIG. 13 is a timing diagram of other signals of the shift register according to an embodiment of the disclosure.

For example, a signal timing diagram corresponding to the shift register unit shown in FIG. 12A is shown in FIG. 13: m1 represents the signal of the control electrode of the first transistor M1. In addition, the other working process of the shift register unit shown in FIG. 12A in combination with the signal timing shown in FIG. 13 can refer to the working process of the above shift register unit, which will not be repeated here.

It should be noted that the first transistor M1 is turned on in both the input phase T1 and the output phase T2 under the control of the signal of the first electrode of the third transistor M3, and thus the second clock signal CK2 at the high level can be provided to the second node N2 in these two phases, to prevent the second node N2 from floating in these two phases, so that the second node N2 can be stabilized (for example, at 7V) in the output phase.

Figure 12B:
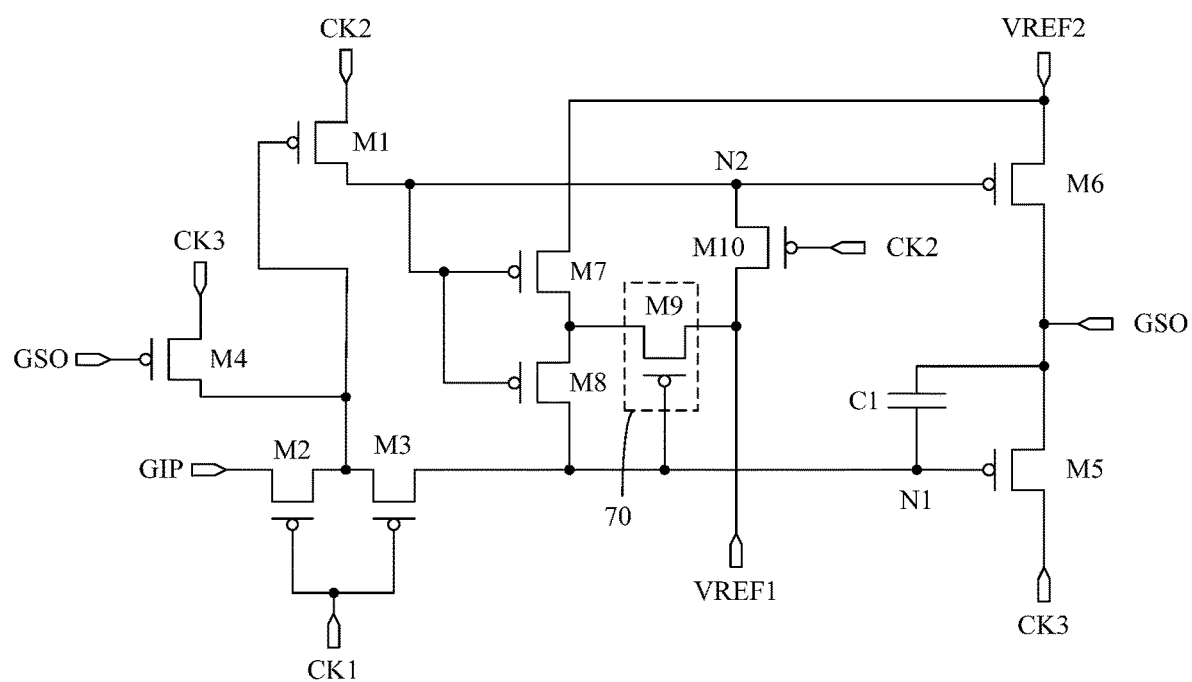
FIG. 12B is a schematic diagram of yet other structures of the shift register unit according to an embodiment of the disclosure.

In some embodiments, since the second clock signal CK2 at the high level is provided to the second node N2 in both the input phase T1 and the output phase T2, the second capacitor C2 may not be arranged, as shown in FIG. 12B. In this way, the occupied space of the shift register unit can be further reduced. For example, when the second capacitor C2 is not arranged at the control electrode of the sixth transistor M6, the width of the channel region of the sixth transistor M6 may be greater than 50 um or 100 um, that is, the stable output of the shift register unit can be realized.

Figure 14A:
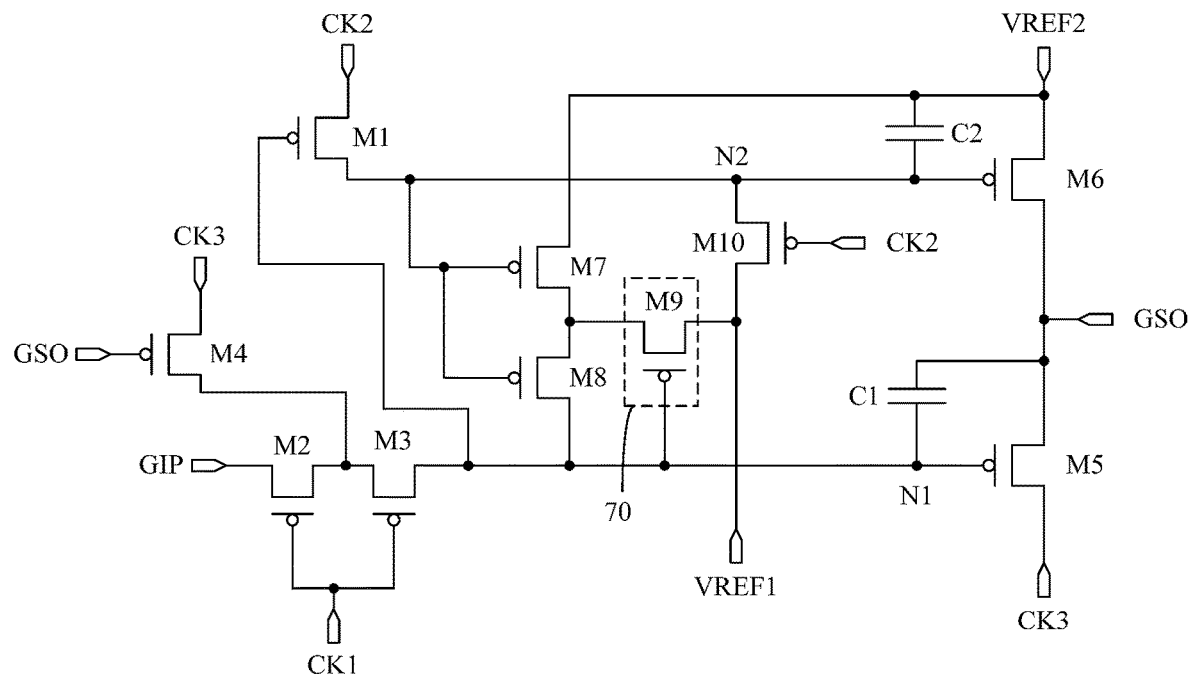
FIG. 14A is a schematic diagram of yet other structures of the shift register according to an embodiment of the disclosure.

An embodiment of the disclosure provides a schematic diagram of yet other structures of the shift register unit, as shown in FIG. 14A, which is modified for the implementations in the above-mentioned embodiments. Only the differences between this embodiment and the above embodiments are illustrated below; and the similarities thereof are not repeated here.

In some embodiments of the disclosure, as shown in FIG. 14A, the first control circuit 30 is coupled to the first node N1, and the signal of the first node N1 is the first control signal CS1. A control electrode of the first transistor M1 is coupled to the first node N1.

Figure 15:
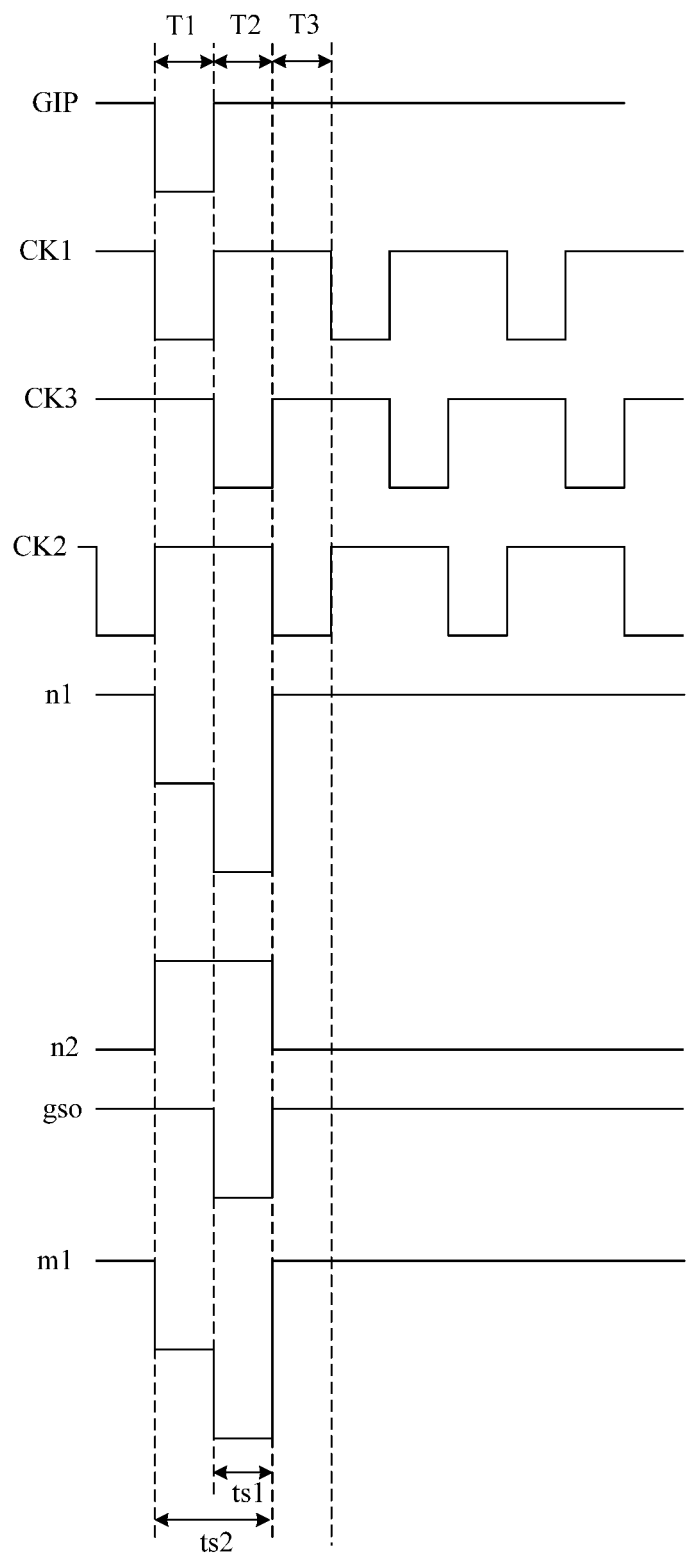
FIG. 15 is a timing diagram of yet other signals of the shift register according to an embodiment of the disclosure.

For example, a signal timing diagram corresponding to the shift register unit shown in FIG. 14A is shown in FIG. 15: ml represents the signal of the control electrode of the first transistor M1. In addition, the other working process of the shift register unit shown in FIG. 14A in combination with the signal timing shown in FIG. 15 can refer to the working process of the above shift register unit, which will not be repeated here.

It should be noted that the first transistor M1 is turned on in both the input phase T1 and the output phase T2 under the control of the signal of the first node N1, and the second clock signal CK2 at the high level can be provided to the second node N2 in these two phases, to prevent the second node N2 from floating in these two phases, so that the second node N2 can be stabilized (for example, at 7V) in the output phase.

Figure 14B:
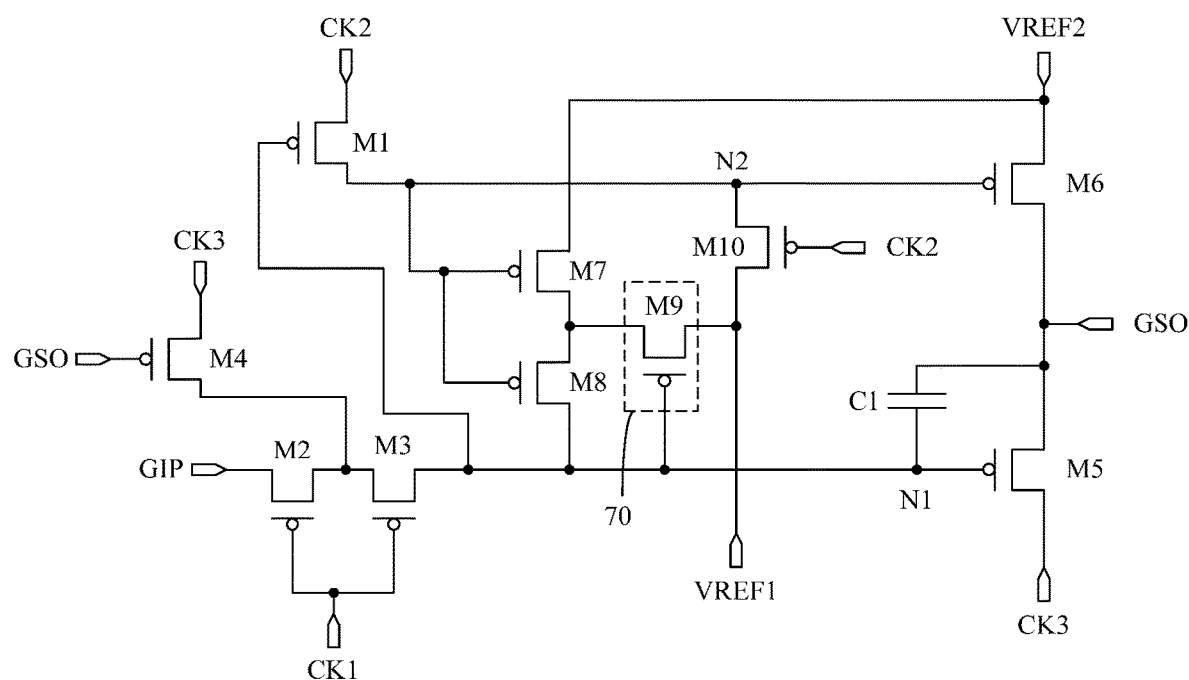
FIG. 14B is a schematic diagram of yet other structures of the shift register unit according to an embodiment of the disclosure.

In some embodiments, since the second clock signal CK2 at the high level is provided to the second node N2 in both the input phase T1 and the output phase T2, the second capacitor C2 may not be arranged, as shown in FIG. 14B. In this way, the occupied space of the shift register unit can be further reduced. For example, when the second capacitor C2 is not arranged at the control electrode of the sixth transistor M6, the width of the channel region of the sixth transistor M6 may be greater than 50 um or 100 um, that is, the stable output of the shift register unit can be realized.

Figure 16:
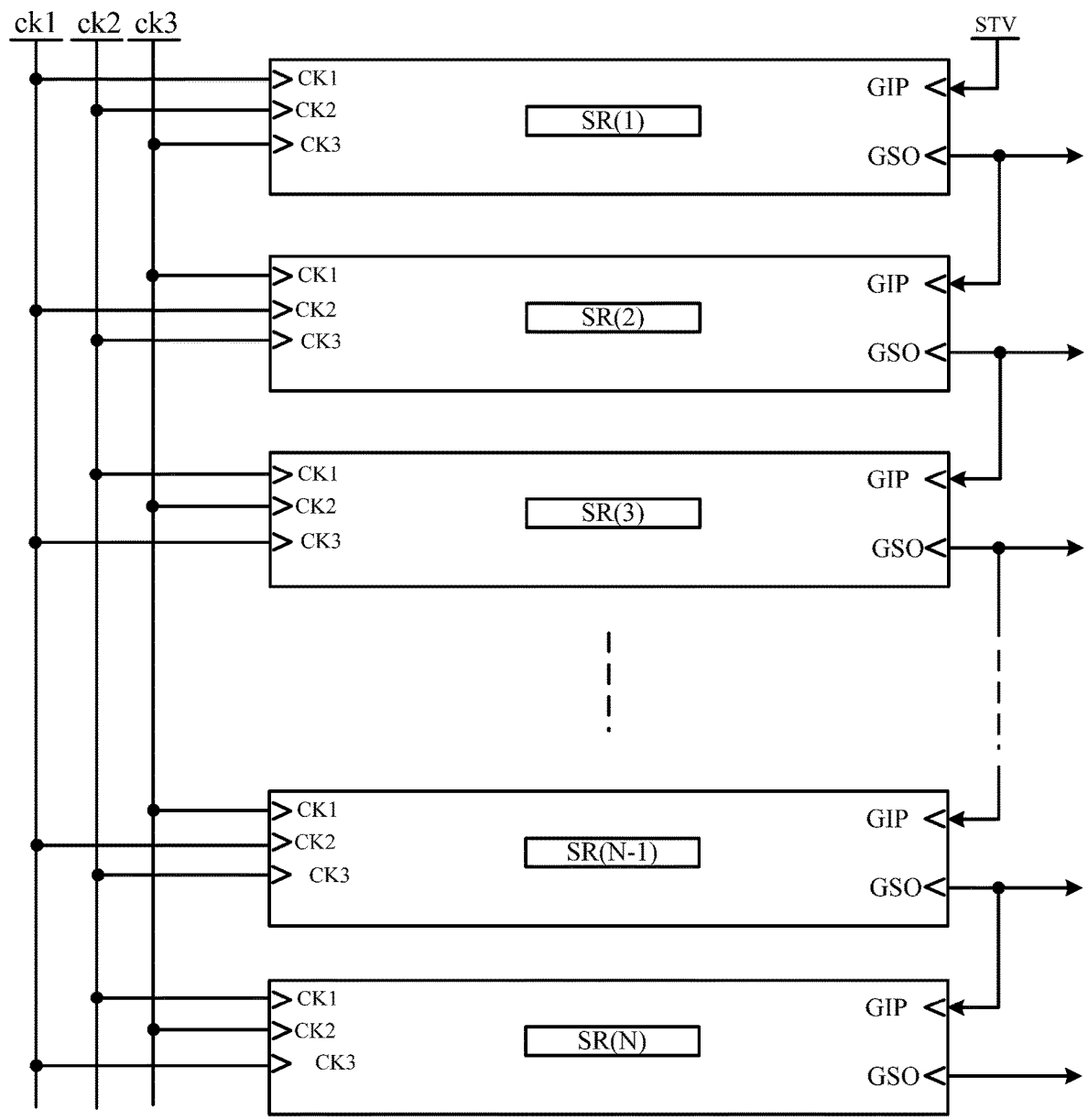
FIG. 16 is a schematic diagram of some structures of a drive control circuit according to an embodiment of the disclosure.

An embodiment of the disclosure further provides some drive control circuits. As shown in FIG. 16, the drive control circuit includes a plurality of cascaded shift register units SR(1). SR(2). SR(3) . . . . SR(N−1) and SR(N) (a total of N shift register units). An input signal GIP of the first-stage shift register unit SR(1) is provided by a frame trigger signal terminal STV; and, among shift register units in two adjacent stages, an input signal GIP of a next-stage shift register unit is provided by the drive output terminal GSO of a previous-stage shift register unit.

The specific structure of each shift register unit in the above drive control circuit is the same in function and structure as the above shift register unit in the disclosure, and the repeated description thereof will be omitted here. The drive control circuit may be configured in a liquid crystal display panel or an electroluminescent display panel, which is not limited here.

In the above drive control circuit provided by an embodiment of the disclosure, the first reference signal VREF1 of the shift register unit in each stage is provided by the same first DC signal terminal, and the second reference signal VREF2 of the shift register unit in each stage is provided by the same second DC signal terminal.

In the above drive control circuit provided by an embodiment of the disclosure, as shown in FIG. 16, the first clock signal CK1 of the shift register unit in the 3k−2th stage, the second clock signal CK2 of the shift register unit in the 3k−1th stage and the third clock signal CK3 of the shift register unit in the $3k^{th}$ stage are all provided by the same clock terminal, i.e., the first clock terminal ck1. The second clock signal CK2 of the shift register unit in the 3k−2th stage, the third clock signal CK3 of the shift register unit in the 3k−1th stage and the first clock signal CK1 of the shift register unit in the $3k^{th}$ stage are all provided by the same clock terminal, i.e., the second clock terminal ck2. The third clock signal CK3 of the shift register unit in the 3k−2th stage, the first clock signal CK1 of the shift register unit in the 3k−1th stage and the second clock signal CK2 of the shift register unit in the $3k^{th}$ stage are all provided by the same clock terminal, i.e., the third clock terminal ck3. Here, k is a positive integer.

An embodiment of the disclosure further provides a display device, including the above-mentioned drive control circuit provided by an embodiment of the disclosure. The principle of the display device to solve the problem is similar to that of the above-mentioned drive control circuit, so the implementations of the display device can refer to the implementations of the above-mentioned drive control circuit, and the detailed description thereof will be omitted here.

During specific implementation, in an embodiment of the disclosure, the display device may be a mobile phone, a tablet, a television, a display: a laptop, a digital photo frame, a navigator, or any other product or component with display functions. All of other indispensable components of the display device should be understood by those ordinary skilled in the art to be included, and will be omitted here and should not be considered as limitations on the disclosure.

In a specific implementation, the display device may include a plurality of pixel units, and a plurality of gate lines and data lines, where each pixel unit may include a plurality of sub-pixels, such as red sub-pixels, green sub-pixels and blue sub-pixels. The above-mentioned display device provided by an embodiment of the disclosure may be an organic light-emitting display device or a liquid crystal display device, which is not limited here.

In an embodiment of the disclosure, a plurality of gate lines are also correspondingly provided with a drive control circuit; and one gate line is coupled to the drive output terminal of the shift register unit in one stage in the drive control circuit. For example, when the above-mentioned display device provided by an embodiment of the disclosure is a liquid crystal display device. TFTs in the sub-pixels may be coupled to the gate lines, and the above-mentioned drive control circuit may be used as a gate drive circuit, which is coupled to the gate lines to provide the gate scanning signals to the TFTs in the sub-pixels. It should be noted that the TFTs in the sub-pixels may be N-type transistors or P-type transistors, which are not limited herein.

In some embodiments of the disclosure, when the above-mentioned display device provided by an embodiment of the disclosure is an organic light-emitting display device, the display device further includes a plurality of light-emitting control signal lines: the plurality of light-emitting control signal lines are correspondingly provided with a drive control circuit; and one light-emitting control signal line is coupled to the drive output terminal of the shift register unit in one stage in the drive control circuit. Also, a plurality of gate lines are also correspondingly provided with a drive control circuit; and one gate line is coupled to the drive output terminal of the shift register unit in one stage in the drive control circuit. For example, the organic light-emitting display device is generally provided with a plurality of organic light-emitting diodes and pixel circuits connected to the organic light-emitting diodes. Generally, the pixel circuit is provided with a light-emitting control transistor for controlling the organic light-emitting diode to emit light and a scan control transistor for controlling the input of data signals.

In a specific implementation, the light-emitting control transistor may be coupled to the light-emitting control signal line, and the scan control transistor may be coupled to the gate line. The organic light-emitting display device may include one above-mentioned drive control circuit provided by embodiments of the disclosure, where the drive control circuit may be used as a light-emitting drive circuit, and the light-emitting drive circuit is coupled to the light-emitting control transistor and used to provide a light-emitting control signal of the light-emitting control transistor. Alternatively, the drive control circuit may also be used as a gate drive circuit, and the gate drive circuit is coupled to the gate line and used to provide a gate scan signal of the scan control transistor.

Of course, the organic light-emitting display device may also include two above-mentioned drive control circuits provided by embodiments of the disclosure, where one drive control circuit may be used as a light-emitting drive circuit coupled to the light-emitting control transistor and used to provide a light-emitting control signal of the light-emitting control transistor; and the other drive control circuit is used as a gate drive circuit coupled to the gate line and used to provide a gate scan signal of the scan control transistor, which is not limited here.

In the shift register unit, drive control circuit, display device and driving method provided by embodiments of the disclosure, by making the duration of the active level of the first control signal longer than the duration of the active level of the signal of the drive output terminal, the conduction duration of the first control circuit can be increased, that is, the duration in which the second clock signal is provided to the second node is increased, to stabilize the level of the second node through the input signal. In this way, the level stability of the second node can be realized without additional setting of a large capacitor, which not only improves the output stability, but also reduces the occupied area.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently, those skilled in the art can make various modifications and variations to embodiments of the disclosure without departing from the spirit and scope of embodiments of the disclosure. Thus, the disclosure is also intended to encompass these modifications and variations to embodiments of the disclosure as long as these modifications and variations come into the scope of the claims of the disclosure and their equivalents.

What is claimed is:

1. A shift register unit, comprising:
   an input circuit configured to provide an input signal to a first node in response to a first clock signal;
   a reset circuit configured to provide a first reference signal to a second node in response to a second clock signal;
   a first control circuit configured to provide the second clock signal to the second node in response to a first control signal;
   an output circuit configured to provide a third clock signal to a drive output terminal in response to a signal of the first node, and provide a second reference signal to the drive output terminal in response to a signal of the second node;
   wherein a duration of an active level of the first control signal is longer than a duration of an active level of a signal of the drive output terminal;
   wherein the input circuit comprises a second transistor;
   a control electrode of the second transistor is configured to receive the first clock signal, a first electrode of the second transistor is configured to receive the input signal, and a second electrode of the second transistor is coupled to the first node;
   wherein the input circuit further comprises a third transistor; and the second electrode of the second transistor is coupled to the first node through the third transistor;
   a control electrode of the third transistor is configured to receive the first clock signal, a first electrode of the third transistor is coupled to the second electrode of the second transistor, and a second electrode of the third transistor is coupled to the first node;
   wherein the shift register unit further comprises: a first noise reduction circuit;
   the first noise reduction circuit is configured to provide the third clock signal to the first electrode of the third transistor in response to the signal of the drive output terminal.

2. The shift register unit according to claim 1, wherein the duration of the active level of the first control signal is approximately equal to twice the duration of the active level of the signal of the drive output terminal.

3. The shift register unit according to claim 1, wherein the first control circuit comprises a first transistor;
   a control electrode of the first transistor is configured to receive the first control signal, a first electrode of the first transistor is configured to receive the second clock signal, and a second electrode of the first transistor is coupled to the second node.

4. The shift register unit according to claim 1, wherein the first noise reduction circuit comprises: a fourth transistor;
   a control electrode of the fourth transistor is coupled to the drive output terminal, a first electrode of the fourth transistor is configured to receive the third clock signal, and a second electrode of the fourth transistor is coupled to the first electrode of the third transistor.

5. The shift register unit according to claim 1, wherein the first control circuit is coupled to the first electrode of the third transistor, and a signal of the first electrode of the third transistor is the first control signal.

6. The shift register unit according to claim 1, wherein the first control circuit is coupled to the first node, and the signal of the first node is the first control signal.

7. The shift register unit according to claim 1, wherein the output circuit comprises: a fifth transistor, a sixth transistor and a first capacitor;
   a control electrode of the fifth transistor is coupled to the first node, a first electrode of the fifth transistor is configured to receive the third clock signal, and a second electrode of the fifth transistor is coupled to the drive output terminal;
   a control electrode of the sixth transistor is coupled to the second node, a first electrode of the sixth transistor is configured to receive the second reference signal, and a second electrode of the sixth transistor is coupled to the drive output terminal;
   a first electrode plate of the first capacitor is coupled to the first node, and a second electrode plate of the first capacitor is coupled to the drive output terminal.

8. The shift register unit according to claim 7, wherein the output circuit further comprises: a second capacitor;
   a first electrode plate of the second capacitor is coupled to the second node, and a second electrode plate of the second capacitor is configured to receive the second reference signal.

9. The shift register unit according to claim 1, further comprising: a second control circuit;

the second control circuit is configured to provide the second reference signal to the first node in response to the signal of the second node.

10. The shift register unit according to claim 9, wherein the second control circuit comprises: a seventh transistor;
a control electrode of the seventh transistor is coupled to the second node, a first electrode of the seventh transistor is configured to receive the second reference signal, and a second electrode of the seventh transistor is coupled to the first node.

11. The shift register unit according to claim 10, wherein the second control circuit further comprises: an eighth transistor; and the second electrode of the seventh transistor is coupled to the first node through the eighth transistor;
a control electrode of the eighth transistor is coupled to the second node, a first electrode of the eighth transistor is coupled to the second electrode of the seventh transistor, and a second electrode of the eighth transistor is coupled to the first node.

12. The shift register unit according to claim 11, further comprising: a second noise reduction circuit;
the second noise reduction circuit is configured to provide the first reference signal to the first electrode of the eighth transistor in response to the signal of the first node.

13. The shift register unit according to claim 12, wherein the second noise reduction circuit comprises: a ninth transistor;
a control electrode of the ninth transistor is coupled to the first node, a first electrode of the ninth transistor is configured to receive the first reference signal, and a second electrode of the ninth transistor is coupled to the first electrode of the eighth transistor.

14. The shift register unit according to claim 1, wherein the reset circuit comprises a tenth transistor;
a control electrode of the tenth transistor is configured to receive the second clock signal, a first electrode of the tenth transistor is configured to receive the first reference signal, and a second electrode of the tenth transistor is coupled to the second node.

15. A drive control circuit, comprising a plurality of cascaded shift register units according to claim 1;
an input signal of a first-stage shift register unit is provided by a frame trigger signal terminal;
among shift register units in two adjacent stages, an input signal of a next-stage shift register unit is provided by the drive output terminal of a previous-stage shift register unit.

16. A display device comprising the drive control circuit according to claim 15.

17. A driving method for the shift register unit according to claim 1, comprising:
in an input phase, providing, by the input circuit, the input signal to the first node in response to the first clock signal; providing, by the first control circuit, the second clock signal to the second node in response to the first control signal; and providing, by the output circuit, the third clock signal to the drive output terminal in response to the signal of the first node;
in an output phase, providing, by the first control circuit, the second clock signal to the second node in response to the first control signal; and providing, by the output circuit, the third clock signal to the drive output terminal in response to the signal of the first node;
in a reset phase, providing, by the reset circuit, the first reference signal to the second node in response to the second clock signal; and providing, by the output circuit, the second reference signal to the drive output terminal in response to a signal of the second node.

* * * * *